United States Patent
Nishikawa et al.

(10) Patent No.: US 6,824,833 B2
(45) Date of Patent: Nov. 30, 2004

(54) STACKED FILM, INSULATING FILM AND SUBSTRATE FOR SEMICONDUCTOR

(75) Inventors: Michinori Nishikawa, Mie (JP); Manabu Sekiguchi, Ibaraki (JP); Matthias Patz, Heverlee (BE); Atsushi Shiota, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/255,941

(22) Filed: Sep. 27, 2002

(65) Prior Publication Data

US 2003/0077461 A1 Apr. 24, 2003

(30) Foreign Application Priority Data

Sep. 28, 2001 (JP) ........................................ 2001-303198

(51) Int. Cl.$^7$ ................................................. B05D 3/02
(52) U.S. Cl. ....................... 427/387; 428/419; 428/446; 428/447; 428/451; 528/14
(58) Field of Search ................................. 428/419, 446, 428/447, 451, 500; 427/387; 528/14

(56) References Cited

U.S. PATENT DOCUMENTS

| | | | | |
|---|---|---|---|---|
| 5,115,082 A | * | 5/1992 | Mercer et al. | 528/219 |
| 5,179,188 A | * | 1/1993 | Mercer et al. | 528/219 |
| 2002/0052125 A1 | * | 5/2002 | Shaffer et al. | 438/780 |
| 2002/0142586 A1 | * | 10/2002 | Shiota | 438/633 |

FOREIGN PATENT DOCUMENTS

| | | |
|---|---|---|
| EP | 1 099 719 | 5/2001 |
| EP | 1 127 929 | 8/2001 |
| EP | 1 146 555 | 10/2001 |
| WO | WO 00/75988 | 12/2000 |
| WO | WO 02/03442 | 1/2002 |
| WO | WO 02/083327 | 10/2002 |

* cited by examiner

*Primary Examiner*—Margaret G. Moore
*Assistant Examiner*—Marc S. Zimmer
(74) *Attorney, Agent, or Firm*—Oblon, Spivak, McClelland, Maier & Neustadt, P.C.

(57) ABSTRACT

A stacked film for semiconductor having superior adhesion to a coating film formed by a CVD process in, for example, semiconductor devices, an insulating film having the stacked film and a substrate for semiconductor using the insulating film are disclosed. The stacked film comprises (A) a film of an organic compound having a carbon content of 60% by weight or more and (B) a film prepared by heating a hydrolytic condensate obtained by hydrolysis and condensation of at least one compound selected from the group consisting of specific compounds represented by the general formulae (51) to (54) described hereinabove.

13 Claims, No Drawings

STACKED FILM, INSULATING FILM AND SUBSTRATE FOR SEMICONDUCTOR

FIELD OF THE INVENTION

The present invention relates to a stacked film, and more particularly, to an insulating film for semiconductor having superior adhesion to a coating film formed by a CVD (Chemical Vapor Deposition) process in, for example, semiconductor devices.

DESCRIPTION OF THE RELATED ART

Hitherto, silica ($SiO_2$) films formed by a vacuum process such as a CVD process have been widely used as dielectric films in, for example, semiconductor devices. In recent years, insulating films of a coating type, comprising a hydrolyzate of a tetraalkoxysilane as a major component, which are called as SOG (Spin on Glass) films, have also been used for the purpose of forming more uniform dielectric films. In addition, as the degree of integration of, for example, semiconductor devices becomes large, dielectric films having a low dielectric constant comprising, as a major component, a polyorganosiloxane called as "organic SOG", have been developed.

Especially, for example, as the semiconductor devices become larger in degree of integration or more multiple in lamination, dielectric film materials having a lower dielectric constant, preferably a dielectric constant of 2.5 or less, and having superior adhesion to a substrate, have been being demanded.

As materials having a low dielectric constant, compositions comprising a mixture of fine particles obtained by condensation of an alkoxysilane in the presence of ammonia and a basic partial hydrolyzate of an alkoxysilane (see JP-A-5-263045 and JP-A-5-315319) and coating solutions obtained by condensation of a basic partial hydrolyzate of a polyalkoxysilane in the presence of ammonia (see JP-A-11-340219 and JP-A-11-340220) have been proposed. However, these materials involved problems such that when used alone, the adhesion to a substrate is inferior and that the dielectric constant exceeds 2.5.

SUMMARY OF THE INVENTION

The present invention relates to a stacked film for overcoming the above-described problems. More particularly, an object of the present invention is to provide an insulating film for semiconductor having superior adhesion to a coating film formed by a CVD process as a dielectric film in, for example, semiconductor devices.

The present invention provides a stacked film comprising (A) a coating film having a carbon content of 60% by weight or more in a composition (this coating film will be sometimes referred to as "film (A)") and (B) a film prepared by heating a hydrolytic condensate obtained by hydrolysis and condensation of at least one compound selected from the group consisting of compounds represented by the following general formulae (51) to (54) (this coating film will be sometimes referred to as "film (B)"):

$$HSi(OR^{51})_3 \quad (51)$$

wherein $R^{51}$ represents a monovalent organic group,

$$R_{a'}Si(OR^{52})_{4-a'} \quad (52)$$

wherein R represents a fluorine atom or a monovalent organic group; $R^{52}$ represents a monovalent organic group; and a' represents an integer of from 1 to 2, $$Si(OR^{53})_4 \quad (53)$$

wherein $R^{53}$ represents a monovalent organic group, and

$$R^{54}{}_{b'}(R^{55}O)_{3-b'}Si-(R^{58})_{d'}-Si(OR^{56})_{3-c'}R^{57}{}_{c'} \quad (54)$$

wherein $R^{54}$ to $R^{57}$ may be the same or different and each represents a monovalent organic group; b' and c' may be the same or different and each represents a number of from 0 to 2; $R^{58}$ represents an oxygen atom, a phenylene group, or a group represented by $-(CH_2)_{n'}-$, wherein n' represents an integer of from 1 to 6; and d' represents 0 or 1.

The present invention further provides an insulating film comprising the above-described stacked film.

The present invention further provides a substrate for semiconductor using the above-described insulating film.

DETAILED DESCRIPTION OF THE INVENTION

In the present invention, the component (A) that is used for forming the film (A) is a polymer having a carbon content of 60% by weight or more, and preferably either one of a polyarylene or a polyarylene ether. Specifically, the polymer is a polymer comprising at least one recurring structural unit selected from the group consisting of the following general formulae (1) to (3).

General formula (1):

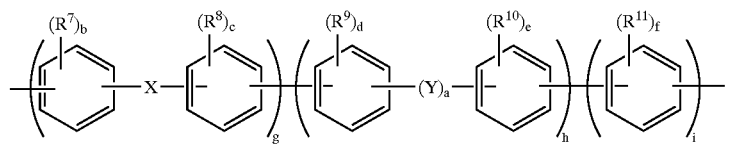

General formula (2):

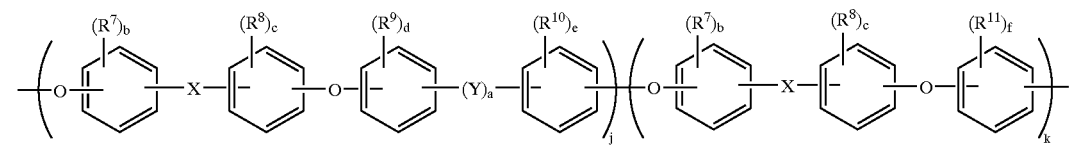

General formula (3):

In the above formulae, $R^7$ to $R^{11}$ each independently represents a hydrocarbon group having from 1 to 20 carbon atoms, a cyano group, a nitro group, an alkoxyl group having from 1 to 20 carbon atoms, an aryl group, or a halogen atom; X represents at least one member selected from the group consisting of a group represented by —CQQ'-(wherein Q and Q' may be the same or different and each represents a halogenated alkyl group, an alkyl group, a hydrogen atom, a halogen atom, or an aryl group) and a fluorenylene group; Y represents at least one member selected from the group consisting of —O—, —CO—, —COO—, —CONH—, —S—, —SO$_2$—, and a phenylene group; a represents 0 or 1; b to f each represents an integer of from 0 to 4; g is from 5 to 100 mole %, h is from 0 to 95 mole %, and i is from 0 to 95 mole %, provided that the total sum of g, h and is 100 mole %; j is from 0 to 100 mole %, and k is from 0 to 100 mole %, provided that the total sum of j and k is 100 mole %; and A and B each independently represents at least one group selected from the group consisting of divalent aromatic groups represented by the following general formulae (4) to (6).

General formula (4):

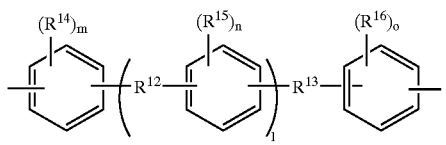

General formula (5):

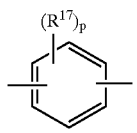

General formula (6):

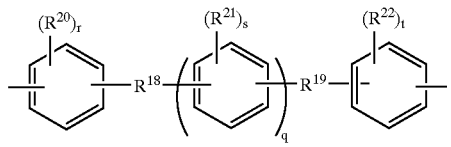

In the above formulae, $R^{12}$, $R^{13}$, $R^{18}$, and $R^{19}$ each independently represents a single bond,

—O—, —CO—, —CH$_2$—,

—COO—, —CONH—, —S—,

—SO$_2$—, 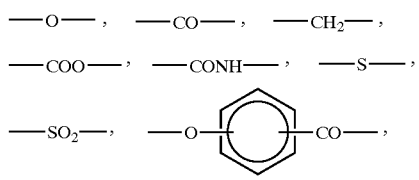

a phenylene group, an isopropylidene group, a hexafluoroisopropylidene group, a diphenyl-methylidene group, or a fluorenylene group; $R^{14}$ to $R^{16}$, $R^{17}$, and $R^{20}$ to $R^{22}$ each independently represents a hydrocarbon group having from 1 to 20 carbon atoms, a cyano group, a nitro group, or an alkoxyl group having from 1 to 20 carbon atoms, an aryl group; l and q each independently represents an integer of from 0 to 3; and m to p and r to t each independently represents an integer of from 0 to 4.

Polymer (1):

The polymer represented by the general formula (1) (hereinafter referred to as "polymer (1)") can be produced by, for example, polymerizing a monomer inclusive of compounds represented by the following general formula (7) in the presence of a catalyst system containing a transition metal compound.

General formula (7):

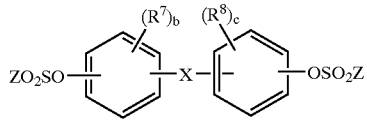

wherein $R^7$ and $R^8$ each independently represents a hydrocarbon group having from 1 to 20 carbon atoms, a cyano group, a nitro group, an alkoxyl group having from 1 to 20 carbon atoms, an aryl group, or a halogen atom; X represents at least one member selected from the group consisting of a group represented by —CQQ'-(wherein Q and Q' may be the same or different and each represents a halogenated alkyl group, an alkyl group, a hydrogen atom, a halogen atom, or an aryl group) and a fluorenylene group; b and c each represents an integer of from 0 to 4; and Z represents an alkyl group, a halogenated alkyl group, or an aryl group.

As to Q and Q' constituting X in the general formula (7), examples of the alkyl group include a methyl group, an ethyl group, an isopropyl group, an n-propyl group, a butyl group, a pentyl group, and a hexyl group; examples of the halogenated alkyl group include a trifluoromethyl group and a pentafluoroethyl group; examples of the arylalkyl group include a benzyl group and a diphenylethyl group; and examples of the aryl group include a phenyl group, a biphenyl group, a tolyl group, and a pentafluorophenyl group.

As to Z constituting —OSO$_2$Z in the general formula (7), examples of the alkyl group include a methyl group and an ethyl group; examples of the halogenated alkyl group include a trifluoromethyl group and a pentafluoroethyl group; and examples of the aryl group include a phenyl group, a biphenyl group, a p-tolyl group, and a p-pentafluorophenyl group.

As X in the general formula (7), divalent groups represented by the following general formulae (8) to (13) are preferable. Of those, a fluorenylene group represented by the general formula (13) is more preferable.

—C(CH$_3$)$_2$—        General Formula (8):

—C(CF$_3$)$_2$—        General Formula (9):

—C(CF$_3$)(C$_6$H$_5$)—        General Formula (10):

—CH(CH$_3$)—        General Formula (11):

—C(C$_6$H$_5$)$_2$—        General Formula (12):

General formula (13):

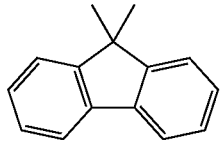

Specific examples of the compound (monomer) represented by the general formula (7) include 2,2-bis(4-methylsulfonyloxyphenyl)hexafluoropropane, bis(4-methylsulfonyloxyphenyl)methane,
bis(4-methylsulfonyloxyphenyl)diphenylmethane,
2,2-bis(4-methylsulfonyloxy-3-methylphenyl) hexafluoropropane, 2,2-bis(4-methylsulfonyloxy-3-propenylphenyl) hexafluoropropane,
2,2-bis(4-methylsulfonyloxy-3,5-dimethylphenyl) hexafluoropropane,
2,2-bis(4-methylsulfonyloxyphenyl)propane,
2,2-bis(4-methylsulfonyloxy-3-methylphenyl)propane,
2,2-bis(4-methylsulfonyloxy-3-propenylphenyl)propane,
2,2-bis(4-methylsulfonyloxy-3,5-dimethylphenyl)propane,
2,2-bis(4-methylsulfonyloxy-3-fluorophenyl)propane,
2,2-bis(4-methylsulfonyloxy-3,5-difluorophenyl)propane,
2,2-bis(4-trifluoromethylsulfonyloxyphenyl)propane,
2,2-bis(4-trifluoromethylsulfonyloxy-3-propenylphenyl) propane,
2,2-bis(4-phenylsulfonyloxyphenyl)propane,
2,2-bis(4-phenylsulfonyloxy-3-methylphenyl)propane,
2,2-bis(4-methylsulfonyloxy-3-propenylphenyl)propane,
2,2-bis(4-phenylsulfonyloxy-3,5-dimethylphenyl)propane,
2,2-bis(4-phenylsulfonyloxy-3-fluorophenyl) diphenylmethane,
2,2-bis(p-tolylsulfonyloxyphenyl)propane,
2,2-bis(p-tolylsulfonyloxy-3-methylphenyl)propane,
2,2-bis(p-tolylsulfonyloxy-3-propenylphenyl)propane,
2,2-bis(p-tolylsulfonyloxy-3,5-dimethylphenyl)propane,
bis(p-tolylsulfonyloxy-3-fluorophenyl)propane,
bis(p-tolylsulfonyloxy-3,5-difluorophenyl)propane,
9,9-bis(4-methylsulfonyloxyphenyl)fluorene,
9,9-bis(4-methylsulfonyloxy-3-methylphenyl)fluorene,
9,9-bis(4-methylsulfonyloxy-3,5-dimethylphenyl)fluorene,
9,9-bis(4-methylsulfonyloxy-3-propenylphenyl)fluorene,
9,9-bis(4-methylsulfonyloxy-3-phenylphenyl)fluorene,
bis(4-methylsulfonyloxy-3-methylphenyl) diphenylmethane,
bis(4-methylsulfonyloxy-3,5-dimethylphenyl) diphenylmethane,
bis(4-methylsulfonyloxy-3-propenylphenyl) diphenylmethane,
bis(4-methylsulfonyloxy-3-fluorophenyl)diphenylmethane,
bis(4-methylsulfonyloxy-3,5-difluorophenyl) diphenylmethane,
9,9-bis(4-methylsulfonyloxy-3-fluorophenyl)fluorene,
9,9-bis(4-methylsulfonyloxy-3,5-difluorophenyl)fluorene,
bis(4-methylsulfonyloxyphenyl)methane,
bis(4-methylsulfonyloxy-3-methylphenyl)methane,
bis(4-methylsulfonyloxy-3,5-dimethylphenyl)methane,
bis(4-methylsulfonyloxy-3-propenylphenyl)methane,
bis(4-methylsulfonyloxyphenyl) trifluoromethylphenylmethane,
bis(4-methylsulfonyloxyphenyl)phenylmethane,
2,2-bis(4-trifluoromethylsulfonyloxyphenyl) hexafluoropropane,
bis(4-trifluoromethylsulfonyloxyphenyl)methane,
bis(4-trifluoromethylsulfonyloxyphenyl)diphenylmethane,
2,2-bis(4-trifluoromethylsulfonyloxy-3-methylphenyl) hexafluoropropane,
2,2-bis(4-trifluoromethylsulfonyloxy-3-propenylphenyl) hexafluoropropane,
2,2-bis(4-trifluoromethylsulfonyloxy-3,5-dimethylphenyl) hexafluoropropane,
9,9-bis(4-trifluoromethylsulfonyloxyphenyl)fluorene,
9,9-bis(4-trifluoromethylsulfonyloxy-3-methylphenyl) fluorene,
9,9-bis(4-trifluoromethylsulfonyl-3,5-dimethylphenyl) fluorene,
9,9-bis(4-trifluoromethylsulfonyloxy-3-propenylphenyl) fluorene,
9,9-bis(4-trifluoromethylsulfonyloxy-3-phenylphenyl) fluorene,
bis(4-trifluoromethylsulfonyloxy-3-methylphenyl) diphenylmethane,
bis(4-trifluoromethylsulfonyloxy-3,5-dimethylphenyl) diphenylmethane,
bis(4-trifluoromethylsulfonyloxy-3-propenylphenyl) diphenylmethane,
bis(4-trifluoromethylsulfonyloxy-3-fluorophenyl) diphenylmethane,
bis(4-trifluoromethylsulfonyloxy-3,5-difluorophenyl) diphenylmethane,
9,9-bis(4-trifluoromethylsulfonyloxy-3-fluorophenyl) fluorene,
9,9-bis(4-trifluoromethylsulfonyloxy-3,5-difluorophenyl) fluorene,
bis(4-trifluoromethylsulfonyloxyphenyl)methane,
bis(4-trifluoromethylsulfonyloxy-3-methylphenyl)methane,
bis(4-trifluoromethylsulfonyloxy-3,5-dimethylphenyl) methane,
bis(4-trifluoromethylsulfonyloxy-3-propenylphenyl) methane,
bis(4-trifluoromethylsulfonyloxyphenyl) trifluoromethylphenylmethane,
bis(4-trifluoromethylsulfonyloxyphenyl),
2,2-bis(4-phenylsulfonyloxyphenyl)hexafluoropropane,
bis(4-phenylsulfonyloxyphenyl)methane,
bis(4-phenylsulfonyloxyphenyl)diphenylmethane,
2,2-bis(4-phenylsulfonyloxy-3-methylphenyl) hexafluoropropane,
2,2-bis(4-phenylsulfonyloxy-3-propenylphenyl) hexafluoropropane,
2,2-bis(4-phenylsulfonyloxy-3,5-dimethylphenyl) hexafluoropropane,
9,9-bis(4-phenylsulfonyloxyphenyl)fluorene,
9,9-bis(4-phenylsulfonyloxy-3-methylphenyl)fluorene,
9,9-bis(4-phenylsulfonyloxy-3,5-dimethylphenyl)fluorene,
9,9-bis(4-phenylsulfonyloxy-3-propenylphenyl)fluorene,
9,9-bis(4-phenylsulfonyloxy-3-phenylphenyl)fluorene,
bis(4-phenylsulfonyloxy-3-methylphenyl)diphenylmethane,
bis(4-phenylsulfonyloxy-3,5-dimethylphenyl) diphenylmethane,
bis(4-phenylsulfonyloxy-3-propenylphenyl) diphenylmethane,
bis(4-phenylsulfonyloxy-3-fluorophenyl)diphenylmethane,
bis(4-phenylsulfonyloxy-3,5-difluorophenyl) diphenylmethane,
9,9-bis(4-phenylsulfonyloxy-3-fluorophenyl)fluorene,
9,9-bis(4-phenylsulfonyloxy-3,5-difluorophenyl)fluorene,
bis(4-phenylsulfonyloxyphenyl)methane,
bis(4-phenylsulfonyloxy-3-methylphenyl)methane,
bis(4-phenylsulfonyloxy-3,5-dimethylphenyl)methane,
bis(4-phenylsulfonyloxy-3-propenylphenyl)methane,
bis(4-phenylsulfonyloxyphenyl) trifluoromethylphenylmethane,
bis(4-phenylsulfonyloxyphenyl)phenylmethane,
2,2-bis(p-tolylsulfonyloxyphenyl)hexafluoropropane,
bis(p-tolylsulfonyloxyphenyl)methane, bis(p-tolylsulfonyloxyphenyl)diphenylmethane,
2,2-bis(p-tolylsulfonyloxy-3-methylphenyl) hexafluoropropane,
2,2-bis(p-tolylsulfonyloxy-3-propenylphenyl) hexafluoropropane,
2,2-bis(p-tolylsulfonyloxy-3,5-dimethylphenyl) hexafluoropropane,
9,9-bis(p-tolylsulfonyloxyphenyl)fluorene,
9,9-bis(p-tolylsulfonyloxy-3-methylphenyl)fluorene,
9,9-bis(p-tolylsulfonyloxy-3,5-dimethylphenyl)fluorene,
9,9-bis(p-tolylsulfonyloxy-3-propenylphenyl)fluorene, 9,9-bis(p-tolylsulfonyloxy-3-phenylphenyl)fluorene,
bis(p-tolylsulfonyloxy-3-methylphenyl)diphenylmethane,
bis(p-tolylsulfonyloxy-3,5-dimethylphenyl)
  diphenylmethane,
bis(p-tolylsulfonyloxy-3-propenylphenyl)diphenylmethane,
bis(p-tolylsulfonyloxy-3-fluorophenyl)diphenylmethane,
bis(p-tolylsulfonyloxy-3,5-difluorophenyl)
  diphenylmethane,
9,9-bis(p-tolylsulfonyloxy-3-fluorophenyl)fluorene,
9,9-bis(p-tolylsulfonyloxy-3,5-difluorophenyl)fluorene,
bis(p-tolylsulfonyloxyphenyl)methane,
bis(p-tolylsulfonyloxy-3-methylphenyl)methane,
bis(p-tolylsulfonyloxy-3,5-dimethylphenyl)methane,
bis(p-tolylsulfonyloxy-3-propenylphenyl)methane,
bis(p-tolylsulfonyloxyphenyl)
  trifluoromethylphenylmethane, and bis(p-
  tolylsulfonyloxyphenyl)phenylmethane.

In the present invention, two or more of the compounds represented by the general formula (7) may be copolymerized.

In the present invention, at least one of the compounds represented by the general formula (7) may be copolymerized with at least one member selected from the group consisting of compounds represented by the following general formulae (14) and (15).

General formula (14):

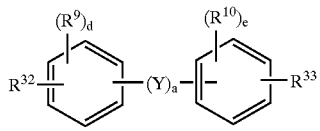

wherein $R^9$ and $R^{10}$ each independently represents a monovalent organic group, or a halogen atom; $R^{32}$ and $R^{33}$ each independently represents —$OSO_2Z$ (wherein Z represents an alkyl group, a halogenated alkyl group, or an aryl group), a chlorine atom, a bromine atom, or an iodine atom; Y represents at least one member selected from the group consisting of —O—, —CO—, —COO—, —CONH—, —S—, —$SO_2$—, and a phenylene group; a represents 0 or 1; and d and e each represents an integer of from 0 to 4.

As to $R^9$ and $R^{10}$, examples of the halogen atom include a fluorine atom. Also, as to the monovalent organic group for $R^9$ and $R^{10}$, examples of the alkyl group include a methyl group and an ethyl group; examples of the halogenated alkyl group include a trifluoromethyl group and a pentafluoroethyl group; examples of the allyl group include a propenyl group; and examples of the aryl group include a phenyl group and a pentafluorophenyl group. Also, as to Z constituting —$OSO_2Z$, examples of the alkyl group include a methyl group and an ethyl group; examples of the halogenated alkyl group include a trifluoromethyl group; and examples of the aryl group include a phenyl group, a p-tolyl group, and a p-fluorophenyl group.

Examples of the compound represented by the general formula (14) include 4,4'-dimethylsulfonyloxybiphenyl, 4,4'-dimethylsulfonyloxy-3,3'-dipropenylbiphenyl, 4,4'-dibromobiphenyl, 4,4'-diiodobiphenyl, 4,4'-dimethylsulfonyloxy-3,3'-dimethylbiphenyl, 4,4'-dimethylsulfonyloxy-3,3'-difluorobiphenyl, 4,4'-dimethylsulfonyloxy-3,3',5,5'-tetrafluorobiphenyl, 4,4'-dibromooctafluorobiphenyl, 4,4'-methylsulfonyloxyoctafluorobiphenyl, 3,3'-diallyl-4,4'-bis(fluorobenzenesulfonyloxy)biphenyl, 4,4'-dichloro-2,2'-trifluoromethylbiphenyl, 4,4'-dibromo-2,2'-trifluoromethylbiphenyl, 4,4'-diiodo-2,2'-trifluoromethylbiphenyl, bis(4-chlorophenyl) sulfone, 4,4'-dichlorobenzophenone, and 2,4-dichlorobenzophenone.

Those compounds represented by the general formula (14) may be used alone or as a mixture of two or more thereof.

General formula (15):

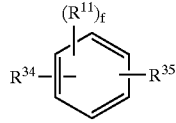

wherein $R^{11}$ represents a monovalent organic group, or a halogen atom; $R^{34}$ and $R^{35}$ each independently represents —$OSO_2Z$ (wherein Z represents an alkyl group, a halogenated alkyl group, or an aryl group), a chlorine atom, a bromine atom, or an iodine atom; and f represents an integer of from 0 to 4.

As to $R^{11}$, examples of the halogen atom include a fluorine atom. Also, as to the monovalent organic group for $R^{11}$, examples of the alkyl group include a methyl group and an ethyl group; examples of the halogenated alkyl group include a trifluoromethyl group and a pentafluoroethyl group; examples of the allyl group include a propenyl group; and examples of the aryl group include a phenyl group and a pentafluorophenyl group. Also, as to Z constituting —$OSO_2Z$, examples of the alkyl group include a methyl group and an ethyl group; examples of the halogenated alkyl group include a trifluoromethyl group; and examples of the aryl group include a phenyl group, a p-tolyl group, and a p-fluorophenyl group.

Examples of the compound represented by the general formula (15) include o-dichlorobenzene, o-dibromobenzene, o-diiodobezene, o-dimethylsulfonyloxybenzene, 2,3-dichlorotoleune, 2,3-dibromotoluene, 2,3-diiodotoluene, 3,4-dichlorotoleune, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromobenzotrifluoride, 3,5-diiodobenzotrifluoride, 1,3-dibromo-2,4,5,6-tetrafluorobenzene, 2,4-dichlorobenzyl alcohol, 3,5-dichlorobenzyl alcohol, 2,4-dibromobenzyl alcohol, 3,5-dibromobenzyl alcohol, 3,5-dichlorophenol, 3,5-dibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate. Of those, m-dichlorobenzene, 2,4-dichlorotoluene, 3,5-dimethylsulfonyloxytoluene, 2,4-dichlorobenzotrifluoride, and 2,4-dichlorophenoxybenzene are preferable.

Those compounds represented by the general formula (15) may be used alone or as a mixture of two or more thereof.

As to the proportion of the recurring structural units in the polymer (1), in the general formula (1), g is from 5 to 100 mole %, and preferably from 5 to 95 mole %; h is from 0 to 95 mole %, and preferably from 0 to 90 mole %; and i is from 0 to 95 mole %, and preferably from 0 to 90 mole %, respectively, provided that the total sum of g, h and i is 100 mole %.

When g is less than 5 mole % (h or i exceeds 95 mole %), the polymer may possibly be poor in solubility in an organic solvent.

The catalyst that is used during the production of the polymer (1) is preferable a catalyst system containing a transition metal compound. This catalyst system contains (1) a transition metal salt and a ligand, or a transition metal (salt) having a ligand coordinated therein, and (2) a reducing agent as essential components. Further, a "salt" may be added thereto in order to increase the polymerization rate.

Examples of the transition metal salt include nickel compounds such as nickel chloride, nickel bromide, nickel iodide, and nickel acetylacetonate; palladium compounds such as palladium chloride, palladium bromide, and palladium iodide; iron compounds such as iron chloride, iron bromide, and iron iodide; and cobalt compounds such as cobalt chloride, cobalt bromide, and cobalt iodide. Of those, nickel chloride and nickel bromide are particularly preferable.

Examples of the ligand include triphenylphosphine, 2,2'-bipyridine, 1,5-cyclooctadiene, and 1,3-bis(diphenylphosphino)propane. Of those, triphenylphosphine and 2,2'-bipyridine are preferable. These ligands may be used alone or as a mixture of two or more thereof.

Examples of the transition metal (salt) having a ligand coordinated therein include nickel chloride 2-triphenylphosphine, nickel bromide 2-triphenylphosphine, nickel iodide 2-triphenylphosphine, nickel nitrate 2-triphenylphosphine, nickel chloride 2,2'-bipyridine, nickel bromide 2,2'-bipyridine, nickel iodide 2,2'-bipyridine, nickel nitrate 2,2'-bipyridine, bis(1,5-cyclooctadiene)nickel, tetrakis(triphenylphosphine)nickel, tetrakis(triphenylphosphite)nickel, and tetrakis(triphenylphosphine)palladium. Of those, nickel chloride 2-triphenylphosphine and nickel chloride 2,2'-bipyridine are preferable.

Examples of the reducing agent that can be used in the catalyst system include iron, zinc, manganese, aluminum, magnesium, sodium, and calcium, with zinc and manganese being preferred. The reducing agent can be used after activation by contacting with an organic acid.

Examples of the "salt" that can be used in the catalyst system include sodium compounds such as sodium fluoride, sodium chloride, sodium bromide, sodium iodide, and sodium sulfate; potassium compounds such as potassium fluoride, potassium chloride, potassium bromide, potassium iodide, and potassium sulfate; and ammonium compounds such as tetraethylammonium fluoride, tetraethylammonium chloride, tetraethylammonium bromide, tetraethylammonium iodide, and tetraethylammonium sulfate. Of those, sodium bromide, sodium iodide, potassium bromide, tetraethylammonium bromide, and tetraethylammonium iodide are preferable.

With respect to the proportion of each component used in the catalyst system, an amount of the transition metal salt or the transition metal (salt) having a ligand coordinated therein is usually from 0.0001 to 10 moles, and preferably from 0.01 to 0.5 moles per mole of the total sum of the compounds represented by the general formulae (7), (14) and (15). When the amount of the transition metal salt or the transition metal (salt) having a ligand coordinated therein is less than 0.0001 moles, the polymerization reaction may not thoroughly proceed, whereas when it exceeds 10 moles, the molecular weight may possibly be lowered.

In the catalyst system, in the case where the transitional metal salt and the ligand are used, an amount of the ligand used is usually from 0.1 to 100 moles, and preferably from 1 to 10 moles per mole of the transition metal salt. When the amount of the ligand used is less than 0.1 moles, the catalytic activity may become insufficient. On the other hand, when it exceeds 100 moles, there is a problem that the molecular weight is lowered.

An amount of the reducing agent used in the catalyst system is usually from 0.1 to 100 moles, and preferably from 1 to 10 moles, per mole of the sum of the compound represented by the general formula (7), the compound represented by the general formula (14), and the compound represented by the general formula (15). When the amount of the reducing agent used is less than 0.1 moles, the polymerization may not thoroughly proceed, whereas when it exceeds 100 moles, the purification of the obtained polymer may possibly become difficult.

In the case where the "salt" is used in the catalyst system, an amount of the "salt" is usually from 0.001 to 100 moles, and preferably from 0.01 to 1 mole, per mole of the sum of the compound represented by the general formula (7), the compound represented by the general formula (14), and the compound represented by the general formula (15). When the amount of the reducing agent used is less than 0.001 moles, an effect for increasing the polymerization rate may possibly become insufficient, whereas when it exceeds 100 moles, the purification of the obtained polymer may possibly become difficult.

Examples of the polymerization solvent that can be used in the present invention include tetrahydrofuran, cyclohexanone, dimethyl sulfoxide, N,N-dimethylformamide, N,N-dimethylacetamide, 1-methyl-2-pyrrolidone, γ-butyrolactone, and γ-butyrolactam, with tetrahydrofuran, N,N-dimethylformamide, N,N-dimethylacetamide, and 1-methyl-2-pyrrolidone being preferred. Preferably, the polymerization solvent is used after thoroughly drying.

Concentration of the sum of the compound represented by the general formula (7), the compound represented by the general formula (14), and the compound represented by the general formula (15) in the polymerization solvent is usually from 1 to 100% by weight, and preferably from 5 to 40% by weight.

Polymerization temperature during the polymerization is usually from 0 to 200° C., and preferably from 50 to 80° C. Further, polymerization time is usually from 0.5 to 100 hours, and preferably from 1 to 40 hours.

Weight average molecular weight, as converted into polystyrene, of the polymer (1) is usually from 1,000 to 1,000,000.

Polymer (2):

The polymer represented by the general formula (2) (hereinafter referred to as "polymer (2)") can be produced by, for example, polymerizing a monomer inclusive of compounds represented by the following general formulae (16) to (18) in the presence of a catalyst system.

General formula (16):

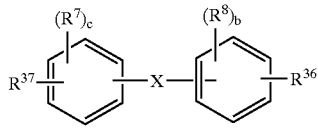

wherein $R^7$ and $R^8$ each independently represents a hydrocarbon group having from 1 to 20 carbon atoms, a cyano group, a nitro group, an alkoxyl group having from 1 to 20 carbon atoms, an aryl group, or a halogen atom; X represents at least one member selected from the group consisting of a group represented by —CQQ'— (wherein Q and Q' may be the same or different and each represents a halogenated alkyl group, an alkyl group, a hydrogen atom, a halogen atom, or an aryl group) and a fluorenylene group; b and c each represents an integer of from 0 to 4; and $R^{36}$ and $R^{37}$ each represents at least one member selected from the group consisting of a hydroxyl group, a halogen atom, and an —OM group (wherein M represents an alkali metal).

Examples of the compound (monomer) represented by the general formula (16) include 2,2-bis(4-hydroxyphenyl)hexafluoropropane, bis(4-hydroxyphenyl)methane, bis(4-hydroxyphenyl)diphenylmethane, 2,2-bis(4-hydroxy-3-methylphenyl)hexafluoropropane, 2,2-bis(4-hydroxy-3-propenylphenyl)hexafluoropropane, 2,2-bis(4-hydroxy-3,5-dimethylphenyl)hexafluoropropane, 2,2-bis(4-hydroxyphenyl)propane, 2,2-bis(4-hydroxy-3-methylphenyl)propane, 2,2-bis(4-hydroxy-3-propenylphenyl)propane, 2,2-bis(4-hydroxy-3,5-dimethylphenyl) propane, 2,2-bis(4-hydroxy-3-fluorophenyl)propane, 2,2-bis(4-hydroxy-3,5-difluorophenyl)propane, 2,2-bis(4-chlorophenyl)hexafluoropropane, bis(4-chlorophenyl)methane, bis(4-chlorophenyl)diphenylmethane, 2,2-bis(4-chloro-3-methylphenyl)hexafluoropropane, 2,2-bis(4-chloro-3-propenylphenyl)hexafluoropropane, 2,2-bis(4-chloro-3,5-dimethylphenyl)hexafluoropropane, 2,2-bis(4-chlorophenyl)propane, 2,2-bis(4-chloro-3-methylphenyl)propane, 2,2-bis(4-chloro-3-propenylphenyl)propane, 2,2-bis(4-chloro-3,5-dimethylphenyl)propane, 2,2-bis(4-chloro-3-fluorophenyl)propane, 2,2-bis(4-chloro-3,5-difluorophenyl)propane, 2,2-bis(4-chlorophenyl)hexafluoropropane, bis(4-bromophenyl)methane, bis(4-bromophenyl)diphenylmethane, 2,2-bis(4-bromo-3-methylphenyl)hexafluoropropane, 2,2-bis(4-bromo-3-propenylphenyl)hexafluoropropane, 2,2-bis(4-bromo-3,5-dimethylphenyl)hexafluoropropane, 2,2-bis(4-bromophenyl)propane, 2,2-bis(4-bromo-3-methylphenyl)propane, 2,2-bis(4-bromo-3-propenylphenyl)propane, 2,2-bis(4-bromo-3,5-dimethylphenyl)propane, 2,2-bis(4-bromo-3-fluorophenyl)propane, 2,2-bis-(4-bromo-3,5-difluorophenyl)propane, bis(4-fluorophenyl)methane, bis(4-fluorophenyl)diphenylmethane, 2,2-bis-(4-fluoro-3-methylphenyl)hexafluoropropane, 2,2-bis-(4-fluoro-3-propenylphenyl)hexafluoropropane, 2,2-bis-(4-fluoro-3,5-dimethylphenyl)hexafluoropropane, 2,2-bis(4-fluorophenyl)propane, 2,2-bis(4-fluoro-3-methylphenyl)propane, 2,2-bis(4-fluoro-3-propenylphenyl)propane, 2,2-bis(4-fluoro-3,5-dimethylphenyl)propane, 2,2-bis(4-fluoro-3-fluorophenyl)propane, and 2,2-bis(4-fluoro-3,5-difluorophenyl)propane.

As to the above-described bisphenol compounds, the hydroxyl group may be substituted with an —OM group (wherein M represents an alkali metal) by a basic compound containing, for example, sodium or potassium.

In the present invention, two or more of the compounds represented by the general formula (16) can be copolymerized with each other.

General formula (17):

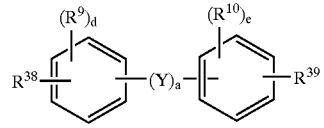

wherein $R^9$ and $R^{10}$ each independently represents a hydrocarbon group having from 1 to 20 carbon atoms, a cyano group, a nitro group, an alkoxyl group having from 1 to 20 carbon atoms, an aryl group, or a halogen atom; $R^{38}$ and $R^{39}$ each represents at least one member selected from the group consisting of a hydroxyl group, a halogen atom, and an —OM group (wherein M represents an alkali metal); Y represents at least one member selected from the group consisting of —O—, —CO—, —COO—, —CONH—, —S—, —SO₂—, and a phenylene group; a represents 0 or 1; and d to e each represents an integer of from 0 to 4.

Examples of the compound represented by the general formula (17) include 4,4'-dichlorobiphenyl, 4,4'-dibromobiphenyl, 4,4'-difluorobiphenyl, 4,4'-diiodobiphenyl, 4,4'-dihydroxybiphenyl, 4,4'-dihydroxy-3,3'-dipropenylbiphenyl, 4,4'-dihydroxy-3,3'-dimethylbiphenyl, 4,4'-dihydroxy-3,3'-diethylbiphenyl, 4,4'-dimethylhydroxy-3,3',5,5'-tetrafluorobiphenyl, 4,4'-dibromooctafluorobiphenyl, 4,4'-dihydroxyoctafluorobiphenyl, 3,3'-diallyl-4,4'-bis(4-hydroxy)biphenyl, 4,4'-dichloro-2,2'-trifluoromethylbiphenyl, 4,4'-dibromo-2,2'-trifluoromethylbiphenyl, 4,4'-diiodo-2,2'-trifluoromethylbiphenyl, bis(4-chlorophenyl) sulfone, bis(4-hydroxyphenyl) sulfone, bis(4-chlorophenyl) ether, bis(4-hydroxyphenyl) ether, 4,4'-dichlorobenzophenone, 4,4'-dihydroxybenzophenone, 2,4-dichlorobenzophenone, and 2,4-dihydroxybenzophenone.

As to the above-described bisphenol compounds, the hydroxyl group may be substituted with an —OM group (wherein M represents an alkali metal) by a basic compound containing, for example, sodium or potassium.

Those compounds represented by the general formula (17) may be used alone or as a mixture of two or more thereof.

General formula (18):

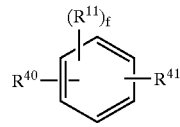

wherein $R^{11}$ represents a hydrocarbon group having from 1 to 20 carbon atoms, a cyano group, a nitro group, an alkoxyl group having from 1 to 20 carbon atoms, an aryl group, or a halogen atom; $R^{40}$ and $R^{41}$ each independently represents —OSO₂Z (wherein Z represents an alkyl group, a halogenated alkyl group, or an aryl group), a chlorine atom, a bromine atom, or an iodine atom; and f represents an integer of from 0 to 4.

Examples of the compound represented by the general formula (18) include 1,2-dihydroxybenzene, 1,3- dihydroxybenzene, 1,4-dihydroxybenzene, 2,3-dihydroxytoluene, 2,5-dihydroxytoluene, 2,6-dihydroxytoluene, 3,4-dihydroxytoluene, 3,5-dihydroxytoluene, o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodotrifluoride, 1,3-dibromo-2,4,5,6-tetrafluorobenzene, 2,4-dichlorobenzyl alcohol, 3,5-dichlorobenzyl alcohol, 2,4-dibromobenzyl alcohol, 3,5-dibromobenzyl alcohol, 3,5-dichlorophenol, 3,5-dibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate.

Those compounds represented by the general formula (18) may be used alone or as a mixture of two or more thereof.

As to the proportion of the recurring structural units in the polymer (2), in the general formula (2), j is from 0 to 100 mole %, and k is from 0 to 100 mole %, provided that the total sum of j and k is 100 mole %.

The polymer (2) represented by the general formula (2) can be synthesized by heating the bisphenol compound and the halide in a solvent in the presence of an alkali metal compound.

As to a proportion of the bisphenol compound and the halide used, an amount of the bisphenol compound is from 45 to 55 mole %, and preferably from 48 to 52 mole %, and an amount of the halide is from 55 to 45 mole %, and preferably from 52 to 48 mole %. When the amount of the bisphenol compound used is less than 45 mole % or exceeds 55 mole %, the molecular weight of the polymer hardly increases so that the coating properties of the coating film may possibly be inferior.

Examples of the alkali metal compound that is used during the synthesis include sodium hydroxide, potassium hydroxide, lithium hydroxide, sodium carbonate, potassium carbonate, lithium carbonate, sodium bicarbonate, potassium bicarbonate, lithium bicarbonate, sodium hydride, potassium hydride, lithium hydride, metallic sodium, metallic potassium, and metallic lithium.

Those alkali metal compounds may be used alone or as a mixture of two or more thereof.

An amount of the alkali metal compound is usually from 100 to 400 mole %, and preferably from 100 to 250 mole %, per mole of the bisphenol compound.

In order to promote the reaction, a co-catalyst may be used. Examples of the co-catalyst include metallic copper, cuprous chloride, cupric chloride, cuprous bromide, cupric bromide, cuprous iodide, cupric iodide, cuprous sulfate, cupric sulfate, cuprous acetate, cupric acetate, cuprous formate, and cupric formate.

An amount of the co-catalyst used is general from 1 to 50 mole %, and preferably from 1 to 30 mole %, per mole of the bisphenol compound.

Examples of the solvent that can be used include pyridine, quinoline, benzophenone, diphenyl ether, dialkoxybenzenes (wherein the alkoxyl group thereof has from 1 to 4 carbon atoms), trialkoxybenzenes (wherein the alkoxyl group thereof has from 1 to 4 carbon atoms), diphenyl sulfone, dimethyl sulfoxide, dimethyl sulfone, diethyl sulfoxide, diethyl sulfone, diisopropyl sulfone, tetrahydrofuran, tetrahydrothiophene, sulfolane, N-methyl-2-pyrrolidone, N-ethyl-2-pyrrolidone, dimethylimidazodinone, γ-butyrolactone, dimethylformamide, and dimethylacetamide.

Those solvents may be used alone or as a mixture of two or more thereof.

During the synthesis of the polymer (2) represented by the general formula (2), reaction concentration is from 2 to 50% by weight on a basis of the weight of the monomer, and reaction temperature is from 50 to 250° C.

Also, in order to remove the metal salts formed during the synthesis of the polymer and the unreacted monomer, it is preferred that the reaction solution is filtered and that the reaction solution is subjected to reprecipitation with a poor solvent against the polymer or is washed with an acidic or alkaline aqueous solution.

Weight average molecular weight, as measured by the GPC method, of the thus obtained polymer (2) is usually from 500 to 500,000, and preferably from 800 to 100,000.

Polymer (3):

The polymer represented by the general formula (3) (hereinafter referred to as "polymer (3)") can be produced by, for example, polymerizing at least one compound selected from the group consisting of compounds represented by the following general formulae (19) and (20) and at least one compound selected from the group consisting of compounds represented by the following general formulae (21) and (22) in the presence of a catalyst.

General formula (19):

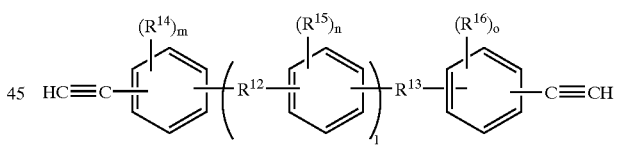

General formula (20):

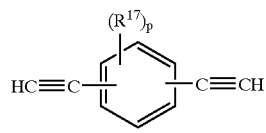

In the above formulae (19) and (20), $R^{12}$ to $R^{17}$ and l to p are the same as defined above with respect to the general formula (3).

General formula (21):

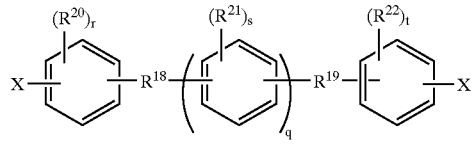

-continued

General formula (22):

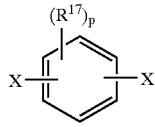

In the above formulae (21) and (22), $R^{17}$ to $R^{22}$ and p to t are the same as defined above with respect to the general formula (3); and X represents a halogen atom.

Examples of the compound represented by the general formula (19) include 4,4'-diethynylbiphenyl, 3,3'-diethynylbiphenyl, 3,4'-diethynylbiphenyl, 4,4'-diethynyldiphenyl ether, 3,3'-diethynyldiphenyl ether, 3,4'-diethynyldiphenyl ether, 4,4'-diethynylbenzophenone, 3,3'-diethynylbenzophenone, 3,4'-diethynylbenzophenone, 4,4'-diethynyldiphenylmethane, 3,3'-diethynyldiphenylmethane, 3,4'-diethynyldiphenylmethane, 4,4'-diethynylbenzoic acid phenyl ester, 3,3'-diethynylbenzoic acid phenyl ester, 3,4'-diethynylbenzoic acid phenyl ester, 4,4'-diethynylbenzanilide, 3,3'-diethynylbenzanilide, 3,4'-diethynylbenzanilide, 4,4'-diethynyldiphenyl sulfide, 3,3'-diethynyldiphenyl sulfide, 3,4'-diethynyldiphenyl sulfide, 4,4'-diethynyldiphenyl sulfone, 3,3'-diethynyldiphenyl sulfone, 3,4'-diethynyldiphenyl sulfone, 2,4,4'-triethynyldiphenyl ether, 9,9-bis(4-ethynylphenyl)fluorene, 4,4''-diethynyl-p-terphenyl, 4,4''-diethynyl-m-terphenyl, and 4,4''-diethynyl-o-terphenyl. Those compounds may be used alone or as a mixture of two or more thereof.

Examples of the compound represented by the general formula (20) include 1,2-diethynylbenzene, 1,3-diethynylbenzene, 1,4-diethynylbenzene, 2,5-diethynyltoluene, and 3,4-diethynyltoluene. Those compounds may be used alone or as a mixture of two or more thereof.

Examples of the compound represented by the general formula (21) include 1,2-bis(2-bromophenoxy)benzene, 1,2-bis(2-iodophenoxy)benzene,
1,2-bis(3-bromophenoxy)benzene, 1,2-bis(3-iodophenoxy)benzene,
1,2-bis(4-bromophenoxy)benzene, 1,2-bis(4-iodophenoxy)benzene,
1,3-bis(2-bromophenoxy)benzene, 1,3-bis(2-iodophenoxy)benzene,
1,3-bis(3-bromophenoxy)benzene, 1,3-bis(3-iodophenoxy)benzene,
1,3-bis(4-bromophenoxy)benzene, 1,3-bis(4-iodophenoxy)benzene,
1,4-bis(3-bromophenoxy)benzene, 1,4-bis(3-iodophenoxy)benzene,
1,4-bis(2-bromophenoxy)benzene, 1,4-bis(2-iodophenoxy)benzene,
1,4-bis(4-bromophenoxy)benzene, 1,4-bis(4-iodophenoxy)benzene,
1-(2-bromobenzoyl)-3-(2-bromophenoxy)benzene,
1-(2-iodobenzoyl)-3-(2-iodophenoxy)benzene,
1-(3-bromobenzoyl)-3-(3-bromophenoxy)benzene,
1-(3-iodobenzoyl)-3-(3-iodophenoxy)benzene,
1-(4-bromobenzoyl)-3-(4-bromophenoxy)benzene,
1-(4-iodobenzoyl)-3-(4-iodophenoxy)benzene,
1-(3-bromobenzoyl)-4-(3-bromophenoxy)benzene,
1-(3-iodobenzoyl)-4-(3-iodophenoxy)benzene,
1-(4-bromobenzoyl)-4-(4-bromophenoxy)benzene,
1-(4-iodobenzoyl)-4-(4-iodophenoxy)benzene,
2,2'-bis(2-bromophenoxy)benzophenone, 2,2'-bis(2-iodophenoxy)benzophenone,
2,4'-bis(2-bromophenoxy)benzophenone, 2,4'-bis(2-iodophenoxy)benzophenone,
4,4'-bis(2-bromophenoxy)benzophenone, 4,4'-bis(2-iodophenoxy)benzophenone,
2,2'-bis(3-bromophenoxy)benzophenone, 2,2'-bis(3-iodophenoxy)benzophenone,
2,4'-bis(3-bromophenoxy)benzophenone, 2,4'-bis(3-iodophenoxy)benzophenone,
4,4'-bis(3-bromophenoxy)benzophenone, 4,4'-bis(3-iodophenoxy)benzophenone,
2,2'-bis(4-bromophenoxy)benzophenone, 2,2'-bis(4-iodophenoxy)benzophenone,
2,4'-bis(4-bromophenoxy)benzophenone, 2,4'-bis(4-iodophenoxy)benzophenone,
4,4'-bis(4-bromophenoxy)benzophenone, 4,4'-bis(4-iodophenoxy)benzophenone,
2,2'-bis(2-bromobenzoyl)benzophenone, 2,2'-bis(2-iodobenzoyl)benzophenone,
2,4'-bis(2-bromobenzoyl)benzophenone, 2,4'-bis(2-iodobenzoyl)benzophenone,
4,4'-bis(2-bromobenzoyl)benzophenone, 4,4'-bis(2-iodobenzoyl)benzophenone,
2,2'-bis(3-bromobenzoyl)benzophenone, 2,2'-bis(3-iodobenzoyl)benzophenone,
2,4'-bis(3-bromobenzoyl)benzophenone, 2,4'-bis(3-iodobenzoyl)benzophenone,
4,4'-bis(3-bromobenzoyl)benzophenone, 4,4'-bis(3-iodobenzoyl)benzophenone,
2,2'-bis(4-bromobenzoyl)benzophenone, 2,2'-bis(4-iodobenzoyl)benzophenone,
2,4'-bis(4-bromobenzoyl)benzophenone, 2,4'-bis(4-iodobenzoyl)benzophenone,
4,4'-bis(4-bromobenzoyl)benzophenone, 4,4'-bis(4-iodobenzoyl)benzophenone,
3,4'-bis(2-bromophenoxy)diphenylether, 3,4'-bis(2-iodophenoxy)diphenylether,
3,4'-bis(3-bromophenoxy)diphenylether, 3,4'-bis(3-iodophenoxy)diphenylether,
3,4'-bis(4-bromophenoxy)diphenylether, 3,4'-bis(4-iodophenoxy)diphenylether,
4,4'-bis(2-bromophenoxy)diphenylether, 4,4'-bis(2-iodophenoxy)diphenylether,
4,4'-bis(3-bromophenoxy)diphenylether, 4,4'-bis(3-iodophenoxy)diphenylether,
4,4'-bis(4-bromophenoxy)diphenylether, 4,4'-bis(4-iodophenoxy)diphenylether,
3,4'-bis(2-bromobenzoyl)diphenylether, 3,4'-bis(2-iodobenzoyl)diphenylether,
3,4'-bis(3-bromobenzoyl)diphenylether, 3,4'-bis(3-iodobenzoyl)diphenylether,
3,4'-bis(4-bromobenzoyl)diphenylether, 3,4'-bis(4-iodobenzoyl)diphenylether,
4,4'-bis(2-bromobenzoyl)diphenylether, 4,4'-bis(2-iodobenzoyl)diphenylether,
4,4'-bis(3-bromobenzoyl)diphenylether, 4,4'-bis(3-iodobenzoyl)diphenylether,
4,4'-bis(4-bromobenzoyl)diphenylether, and 4,4'-bis(4-iodobenzoyl)diphenylether.
2'-bis(4-chlorophenyl)isopropylidene, 2,2'-bis(4-iodophenyl)isopropylidene,
2,2'-bis(4-bromophenyl)isopropylidene, 2,2'-bis(3-chlorophenyl)isopropylidene,
2,2'-bis(3-iodophenyl)isopropylidene, 2,2'-bis(3-bromophenyl)isopropylidene, 2,2'-bis(4-chlorophenyl)hexafluoroisopropylidene,
2,2'-bis(4-iodophenyl)hexafluoroisopropylidene,
2,2'-bis(4-bromophenyl)hexafluoroisopropylidene,
2,2'-bis(3-chlorophenyl)hexafluoroisopropylidene,
2,2'-bis(3-iodophenyl)hexafluoroisopropylidene,
2,2'-bis(3-bromophenyl)hexafluoroisopropylidene,
2,2'-bis(4-chlorophenyl)diphenylmethylidene,
2,2'-bis(4-iodophenyl)diphenylmethylidene,
2,2'-bis(4-bromophenyl)diphenylmethylidene,
2,2'-bis(3-chlorophenyl)diphenylmethylidene,
2,2'-bis(3-iodophenyl)diphenylmethylidene,
2,2'-bis(3-bromophenyl)diphenylmethylidene, 9,9-bis(4-chlorophenyl)fluorene,
9,9-bis(4-iodophenyl)fluorene, 9,9-bis(4-bromophenyl)fluorene,
9,9-bis(3-chlorophenyl)fluorene, 9,9-bis(3-iodophenyl)fluorene,
9,9-bis(3-bromophenyl)fluorene, 4,4"-dichloro-m-terphenyl, 4,4"-diiodo-m-terphenyl,
4,4"-dibromo-m-terphenyl, 4,4"-dichloro-p-terphenyl, 4,4"-diiodo-p-terphenyl, and 4,4"-dibromo-p-terphenyl. Those compounds may be used alone or as a mixture of two or more thereof.

Examples of the compound represented by the general formula (22) include 1,2-dichlorobenzene, 1,3-dichlorobenzene, 1,4-dichlorobenzene, 1,2-diiodobenzene, 1,3-diiodobenzene, 1,4-diiodobenzene, 1,2-dibromobenzene, 1,3-dibromobenzene, 1,4-dibromobenzene, 2,3-dichlorotoluene, 2,4-dichlorotoluene, 2,5-dichlorotoluene, 2,6-dichlorotoluene, 3,4-dichlorotoluene, 2,3-diiodotoluene, 2,4-diiodotoluene, 2,5-diiodotoluene, 2,6-diiodotoluene, 3,4-diiodotoluene, 2,3-dibromotoluene, 2,4-dibromotoluene, 2,5-dibromotoluene, 2,6-dibromotoluene, and 3,4-dibromotoluene. Those compounds may be used alone or as a mixture of two or more thereof.

In the present invention, the polymer (3) is produced by polymerizing the compound represented by the general formula (19) and/or the compound represented by the general formula (20) and the compound represented by the general formula (21) and/or the compound represented by the general formula (22) in the presence of a catalyst. As to a proportion of the compound represented by the general formula (19) and/or the compound represented by the general formula (20) to the compound represented by the general formula (21) and/or the compound represented by the general formula (22) to be used, the total amount of the latter compounds is from 0.8 to 1.2 moles, preferably from 0.9 to 1.1 moles, and more preferably from 0.95 to 1.05 moles, per mole of the total amount of the former compounds. When the total amount of the latter compounds is less than 0.8 moles or exceeds 1.2 moles, the molecular weight of the obtained polymer hardly increases.

In the production of the polymer (3), it is preferred that the above compounds are polymerized in the presence of a catalyst containing a transition metal compound. Further, it is more preferred to use a catalyst containing a transition metal and a basic compound. Particularly, those constituted of the following components (a), (b) and (c) are preferable.

(a) Palladium salt and a substance capable of bonding as a ligand to palladium or feeding a group (atomic group) bounding as a ligand to form a complex (inclusive of complexions) (hereinafter, referred to as "ligand-forming material"), or a palladium complex (to which the ligand-forming material may be further added, if desired)

(b) Monovalent copper compound (c) Basic compound

Examples of the palladium salt include palladium chloride, palladium bromide, and palladium iodide.

Examples of the ligand-forming material include triphenylphosphine, tri-o-tolylphosphine, tricyanophenylphosphine, and tricyanophenylphosphine, with triphenylphosphine being preferred. Those compounds may be used alone or as a mixture of two or more thereof.

Examples of the palladium complex include dichlorobis(triphenylphosphine)palladium, dibromobis(triphenylphosphine)palladium, diiodobis(triphenylphosphine)palladium, dichlorobis(tri-o-tolylphosphine)palladium, dichlorobis(tricyanophenylphosphine)palladium, dichlorobis(tricyanophenylphosphine) palladium, dibromobis(tri-o-tolylphosphine)palladium, dibromobis(tricyanophenylphosphine)palladium, dibromobis(tricyanomethylphosphine) palladium, diiodobis(tri-o-tolylphosphine)palladium, diiodobis(tricyanophenylphosphine) palladium, diiodobis(tricyanophenylphosphine)palladium, tetrakis(triphenylphosphine)palladium, tetrakis(tri-o-tolylphosphine)palladium, tetrakis(tricyanophenylphosphine)palladium, and tetrakis(tricyanophenylphosphine)palladium, with dichlorobis(triphenylphosphine)palladium and tetrakis(triphenylphosphine)palladium being preferred. These compounds may be used alone or as a mixture of two or more thereof.

Examples of the monovalent copper compound include copper(I) chloride, copper(I) bromide, and copper(I) iodide. Those compounds may be used alone or as a mixture of two or more thereof.

Amount of the catalyst used is as follows.

The amount of the palladium salt used is preferably from 0.0001 to 10 moles, and more preferably from 0.001 to 1 mole, per mole of the sum of the compounds represented by the general formulae (19) to (22). When the amount of the palladium salt is less than 0.0001 moles, the polymerization may not thoroughly proceed, whereas when it exceeds 10 moles, the purification may possibly become difficult.

The amount of the ligand-forming material used is preferably from 0.0004 to 50 moles, and more preferably from 0.004 to 5 moles, per mole of the sum of the compounds represented by the general formulae (19) to (22). When the amount of the ligand-forming material is less than 0.0004 moles, the polymerization may not thoroughly proceed, whereas when it exceeds 50 moles, the purification may possibly become difficult.

The amount of the palladium complex used is preferably from 0.0001 to 10 moles, and more preferably from 0.001 to 1 mole, per mole of the sum of the compounds represented by the general formulae (19) to (22). When the amount of the palladium complex is less than 0.0001 moles, the polymerization may not thoroughly proceed, whereas when it exceeds 10 moles, the purification may possibly become difficult.

The amount of the monovalent copper compound used is preferably from 0.0001 to 10 moles, and more preferably from 0.001 to 1 mole, per mole of the sum of the compounds represented by the general formulae (19) to (22). When the amount of the monovalent copper compound is less than 0.0001 moles, the polymerization may not thoroughly proceed, whereas when it exceeds 10 moles, the purification may possibly become difficult.

Examples of the basic compound include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, diethylamine, ammonia, n-butylamine, and imidazole. Of those, diethylamine, piperidine, and n-butylamine are preferred. Those compounds may be used alone or as a mixture of two or more thereof.

The amount of the basic compound used is preferably from 1 to 1,000 moles, and more preferably from 1 to 100 moles, per mole of the sum of the compounds represented by the general formulae (19) to (22). When the amount of the basic compound is less than 1 mole, the polymerization may not thoroughly proceed. On the other hand, the amount exceeding 1,000 moles is not economical.

In the production method according to the present invention, a solvent can be used, if desired. The polymerization solvent used is not particularly limited. Examples of the solvent include halogen-based solvents such as chloroform, dichloromethane, 1,2-dichloroethane, chlorobenzene, and dichlorobenzene; aromatic hydrocarbon-based solvents such as benzene, toluene, xylene, mesitylene, and diethylbenzene; ether-based solvents such as diethyl ether, tetrahydrofuran, dioxane, diglyme, anisole, diethylene glycol dimethyl ether, diethylene glycol diethyl ether, and diethylene glycol methyl ethyl ether; ketone-based solvents such as acetone, methyl ethyl ketone, 2-heptanone, cyclohexanone, and cyclopentanone; ester-based solvents such as methyl acetate, ethyl acetate, propyl acetate, butyl acetate, methyl lactate, ethyl lactate, butyl lactate, and γ-butyrolactone; and amide-based solvents such as N,N-dimethylformamide, N,N-dimethylacetamide, and N-methyl-2-pyrrolidone. Preferably, these solvents are used after thorough drying and deoxidation. Those solvents may be used alone or as a mixture of two or more thereof.

Concentration of the monomers (polymerization components) in the polymerization solvent is preferably from 1 to 80% by weight, and more preferably from 5 to 60% by weight.

Polymerization temperature is preferably from 0 to 150° C., and more preferably from 5 to 100° C. Polymerization time is preferably from 0.5 to 100 hours, and more preferably from 1 to 40 hours.

In the present invention, in order to form the film (A), a film forming coating solution (A) of the above-described polyarylene and polyarylene ether, or either one of them, dissolved in an organic solvent is prepared and applied on a substrate, followed by heating.

Examples of the organic solvent that can be used for the film forming coating solution (A) include aliphatic hydrocarbon-based solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon-based solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, and cresol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone-based solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohaxanone, cyclopentanone, 2-hexanone, methylcyclohexanone, 2,4-pentanedione, acetonylacetone, diacetone alcohol, acetophenone, and fenchone; ether-based solvents such as ethyl ether, isopropyl ether, n-butyl ether, n-hexyl ether, 2-ethylhexyl ether, ethylene oxide, 1,2-propylene oxide, dioxolan, 4-dimethyl dioxolan, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester-based solvents such as diethyl carbonate, ethylene carbonate, propylene carbonate, diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, acetic acid ethylene glycol monomethyl ether, acetic acid ethylene glycol monoethyl ether, acetic acid diethylene glycol monomethyl ether, acetic acid diethylene glycol monoethyl ether, acetic acid diethylene glycol mono-n-butyl ether, acetic acid propylene glycol monomethyl ether, acetic acid propylene glycol monoethyl ether, acetic acid propylene glycol monopropyl ether, acetic acid propylene glycol monobutyl ether, acetic acid dipropylene glycol monomethyl ether, acetic acid dipropylene glycol monoethyl ether, diacetic acid glycol, methoxyacetatic acid triglycol, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone.

Those solvents may be used alone or as a mixture of two or more thereof.

In the present invention, components such as colloidal silica, organic polymers other than the component (A), surfactants, silane coupling agents, radical initiators, compounds containing a polymerizable double bond, and compounds containing a polymerizable triple bond may further be added to the film forming coating solution (A).

Examples of the organic polymers include compounds having an oligosaccharide, vinylamide-based polymers, (meth)acrylic polymers, aromatic vinyl compounds, dendrimer, polyimides, polyamic acid, polyamides, polyquinoxalines, polyoxadiazoles, fluorocarbon polymers, and compounds having a polyalkylene oxide structure.

Examples of the polymers having a polyalkylene oxide structure are polymers having a polymethylene oxide structure, a polyethylene oxide structure, a polypropylene oxide structure, a polytetramethylene oxide structure, or a polybutylene oxide structure.

Examples of the surfactant include nonionic surfactants, anionic surfactants, cationic surfactants, and ampholytic surfactants. Further examples thereof include fluorocarbon-based surfactants, silicone-based surfactants, polyalkylene oxide-based surfactants, and poly(meth)acrylate-based surfactants. Of those, fluorocarbon-based surfactants and silicone-based surfactants are preferable.

Examples of the silane coupling agent include 3-glycidoxypropyl trimethoxysilane, 3-aminoglycidoxypropyl triethoxysilane, 3-methacryloxypropyl trimethoxysilane, 3-glycidoxypropylmethyl dimethoxysilane, 1-methacryloxy-propylmethyl dimethoxysilane, 3-aminopropyl trimethoxysilane, 3-aminopropyl triethoxysilane, 2-aminopropyl trimethoxysilane, 2-aminopropyl triethoxysilane, N-(2-aminoethyl)-3-aminopropyl trimethoxysilane, N-(2-aminoethyl)-3-aminopropylmethyl dimethoxysilane, 3-ureidopropyl trimethoxysilane, 3-ureidopropyl triethoxysilane, N-ethoxycarbonyl-3-aminopropyl trimethoxysilane, N-ethoxycarbonyl-3-aminopropyl triethoxysilane, N-triethoxysilylpropyl triethylenetriamine, N-triethoxysilylpropyl triethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyl trimethoxysilane, N-benzyl-3-aminopropyl triethoxysilane, N-phenyl-3-aminopropyl trimethoxysilane, N-phenyl-3-aminopropyl triethoxysilane, N-bis(oxyethylene)-3-aminopropyl trimethoxysilane, N-bis(oxyethylene)-3-aminopropyl triethoxysilane, poly(vinyl methoxysiloxane), and poly(vinyl ethoxysiloxane).

Those silane coupling agents may be used alone or as a mixture of two or more thereof.

Examples of the radical initiator include organic peroxides such as isobutyryl peroxide, α,α'-bis(neodecanoyl peroxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di(2-ethylhexyl peroxy)dicarbonate, t-hexyl peroxyneodicarbonate, dimethoxybutyl peroxydicarbonate, di(3-methyl-3-methoxybutyl peroxy)dicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoyl peroxy)hexane, 1-cyclohexyl-1-methylethyl peroxy-2-ethylhexanoate, t-hexyl peroxy-2-ethylhexanoate, t-butyl peroxy-2-ethylhexanoate, m-toluoylandbenzoyl peroxide, benzoyl peroxide, t-butyl peroxyisobutyrate, di-t-butyl peroxy-2-methylcyclohexane, 1,1-bis(t-hexyl peroxy)-3,3,5-trimethylcyclohexane, 1,1-bis(t-hexyl peroxy)cycloxane, 1,1-bis(t-butyl peroxy)-3,3,5-trimethylcyclohexane, 1,1-bis(t-butyl peroxy)cyclohexane, 2,2,-bis(4,4-di-t-butyl peroxycyclohexyl)propane, 1,1-bis(t-butyl peroxy)cyclodecane, t-hexyl peroxyisopropyl monocarbonate, t-butyl peroxymaleic acid, t-butyl peroxy-3,3,5-trimethylhexanoate, t-butyl peroxylaurate, 2,5-dimethyl-2,5-di(m-toluoyl peroxy)hexane, t-butyl peroxyisopropyl monocarbonate, t-butyl peroxy-2-ethylhexyl monocarbonate, t-hexyl peroxybenzoate, 2,5-dimethyl-2,5-di(benzoyl peroxy)hexane, t-butyl peroxyacetate, 2,2-bis(t-butyl peroxy)butane, t-butyl peroxybenzoate, n-butyl-4,4-bis(t-butyl peroxy) valerate, di-t-butyl peroxyisophthalate, α,α'-bis(t-butyl peroxy)diisopropylbenzene, dicumyl peroxide, 2,5-dimethyl-2,5-di(t-butyl peroxy)hexane, t-butylcumyl peroxide, di-t-butyl peroxide, p-methane hydroperoxide, 2,5-dimethyl-2,5-di(t-butyl peroxy)hexane-3,diisopropylbenzene hydroperoxide, t-butyltrimethylsilyl peroxide, 1,1,3,3-tetramethylbutyl hydroperoxide, cumene hydro-peroxide, t-hexyl hydroperoxide, and t-butyl hydroperoxide; and bibenzyl compounds such as dibenzyl, 2,3-dimethyl-2,3-diphenylbutane, α,α'-dimethoxy-α,α'-diphenylbibenzyl, α,α'-diphenyl-α-methoxybibenzyl, α,α'-diphenyl-α,α'-dimethoxybibenzyl, α,α'-dimethoxy-α,α'-dimethylbibenzyl, α,α'-dimethoxybibenzyl, 3,4-dimethyl-3,4-diphenyl-n-hexane, and 2,2,3,3-tetrasuccinic acid nitrile.

Those radical initiators may be used alone or as a mixture of two or more thereof.

Examples of the compound containing a polymerizable double bond include ally compounds such as allylbenzene, diallylbenzene, triallylbenzene, allyloxybenzene, diallyloxybenzene, triallyloxybenzene, α,ω-diallyoxyalkanes, α,ω-diallylalkenes, α,ω-diallylalkenes, allylamine, diallylamine, triallylamine, N-allylphthalimide, N-allylpyromellitimide, N,N'-diallylurea, triallyl isocyanurate, and 2,2'-diallyl bisphenol A; vinyl compounds such as styrene, divinylstyrene, trivinylstyrene, stilbene, propenylbenzene, dipropenylbenzene, tripropenylbenzene, phenyl vinyl ketone, methyl styryl ketone, α,α'-divinylalkanes, α,α'-divinylalkanes, α,α'-divinylalkanes, α,α'-divinyloxyalkanes, α,α'-divinylalkenes, α,α'-divinylalkanes, α,α'-diacryloxyalkanes, α,α'-diacrylalkenes, α,α'-diacrylalkenes, α,α'-dimethacryloxyalkanes, α,α'-dimethacrylalkenes, α,α'-dimethacrylalkynes, bisacryloxybenzene, trisacryloxybenzene, bismethacryloxybenzene, trismethacryloxybenzene, N-vinylphthalimide, and N-vinylpyromellitimide; polyarylene ethers containing 2,2'-diallyl-4,4'-biphenol; and polyarylenes containing 2,2'-diallyl-4,4'-biphenol.

Those compounds containing a polymerizable double bond may be used alone or as a mixture of two or more thereof.

As the compound containing a polymerizable triple bond, either one of the compound represented by the following general formula (23) or the compound represented by the following general formula (24) can be used.

General formula (23):

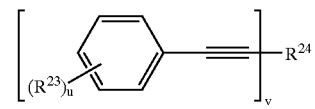

General formula (24):

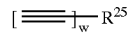

In the formulae (23) and (24), $R^{24}$ represents an aromatic group having a valence of v; $R^{25}$ represents an aromatic group having a valence of w; $R^{23}$ represents an alkyl group having from 1 to 3 carbon atoms; u represents an integer of from 0 to 5; and v and w each independently represents an integer of from 2 to 6.

In the general formula (23), $R^{23}$ represents an alkyl group having from 1 to 3 carbon atoms, and examples of alkyl group include a methyl group, an ethyl group, an n-propyl group, and an isopropyl group. $R^{24}$ in the general formula (23) and $R^{25}$ in the general formula (24) represent an aromatic group having a valence of v and an aromatic group having a valence of w respectively.

Other examples of the compound containing a polymerizable triple bond include ethynylbenzene, bis(trimethylsilylethynyl)benzene, tris(trimethylsilylethynyl)benzene, bis(trimethylsilylethynylphenyl) ether, and trimethylsilylethynylbenzene.

Those compounds containing a polymerizable triple bond may be used alone or as a mixture of two or more thereof.

Concentration of the total solids in the film forming coating solution (A) is preferably from 1 to 30% by weight, and is properly adjusted depending on the use purpose. When the concentration of the total solids in the composition is within the range of from 1 to 30% by weight, the film thickness of the coating film falls within a suitable range and is more superior in storage stability.

In the present invention, the hydrolytic condensate that is used for forming the film (B) is at least one of specific hydrolyzates and their condensates of at least one compound selected from the group consisting of Compounds (51) to (54).

In the hydrolyzate as referred to in the present invention, it is not essential that all of the $R^{51}O$— group, the $R^{52}O$— group, the $R^{53}O$— group, the $R^{55}O$— group, and the $R^{56}O$— group contained in Compounds (51) to (54) are hydrolyzed. For example, the hydrolyzate may be one in which only one of the above groups is hydrolyzed or one in which two or more of the above groups are hydrolyzed, or a mixture thereof.

Further, in the hydrolytic condensate as referred to in the present invention, silanol groups in the hydrolyzates of Compounds (51) to (54) are condensed to form Si—O—Si bonds. In the present invention, it is not essential that all of the silanol groups are condensed. The condensate includes one in which only a part of the silanol groups is condensed and a mixture of those having a different degree of condensation.

Compound (51):

In the above general formula (51), examples of the monovalent organic group for $R^{51}$ include an alkyl group, an aryl group, an allyl group, and a glycidyl group.

Examples of the alkyl group include a methyl group, an ethyl group, a propyl group, and a butyl group. The alkyl group preferably has from 1 to 5 carbon atoms and may be linear or branched. Further, the hydrogen atom(s) may be substituted with a fluorine atom.

In the general formula (51), examples of the aryl group include a phenyl group, a naphthyl group, a methylphenyl group, an ethylphenyl group, a chlorophenyl group, a bromophenyl group, and a fluorophenyl group.

Specific examples of the compound represented by the general formula (51) include trimethoxysilane, triethoxysilane, tri-n-propoxysilane, triisopropoxysilane, tri-n-butoxysilane, tri-sec-butoxysilane, tri-t-butoxysilane, and triphenoxysilane.

Compound (51) are preferably trimethoxysilane, triethoxysilane, tri-n-propoxysilane, and triisopropoxysilane.

Those compounds may be used alone or as a mixture of two or more thereof.

Compound (52):

In the above general formula (52), examples of the monovalent organic group for R and $R^{52}$ include an alkyl group, an aryl group, an allyl group, and a glycidyl group. In the general formula (52), R is preferably a monovalent organic group, and especially an alkyl group or a phenyl group.

Examples of the alkyl group include a methyl group, an ethyl group, a propyl group, and a butyl group. The alkyl group preferably has from 1 to 5 carbon atoms and may be linear or branched. Further, the hydrogen atom(s) may be substituted with a fluorine atom.

In the general formula (52), examples of the aryl group include a phenyl group, a naphthyl group, a methylphenyl group, an ethylphenyl group, a chlorophenyl group, a bromophenyl group, and a fluorophenyl group.

Specific examples of the compound represented by the general formula (52) include fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-t-butoxysilane, fluorotriphenoxysilane; methyltrimethoxysilane, methyl triethoxysilane, methyl tri-n-propoxysilane, methyl triisopropoxysilane, methyl tri-n-butoxysilane, methyl tri-sec-butoxysilane, methyl tri-t-butoxysilane, methyl triphenoxysilane, ethyl trimethoxysilane, ethyl triethoxysilane, ethyl tri-n-propoxysilane, ethyl triisopropoxysilane, ethyl tri-n-butoxysilane, ethyl tri-sec-butoxysilane, ethyl tri-t-butoxysilane, ethyl triphenoxysilane, vinyl trimethoxysilane, vinyl triethoxysilane, vinyl tri-n-propoxysilane, vinyl triisopropoxysilane, vinyl tri-n-butoxysilane, vinyl tri-sec-butoxysilane, vinyl tri-t-butoxysilane, vinyl triphenoxysilane, n-propyl trimethoxysilane, n-propyl triethoxysilane, n-propyl tri-n-propoxysilane, n-propyl triisopropoxysilane, n-propyl tri-n-butoxysilane, n-propyl tri-sec-butoxysilane, n-propyl tri-t-butoxysilane, n-propyl triphenoxysilane, isopropyl trimethoxysilane, isopropyl triethoxysilane, isopropyl tri-n-propoxysilane, isopropyl triisopropoxysilane, isopropyl tri-n-butoxysilane, isopropyl tri-sec-butoxysilane, isopropyltri-t-butoxysilane, isopropyl triphenoxysilane, n-butyl trimethoxysilane, n-butyl triethoxysilane, n-butyl tri-n-propoxysilane, n-butyl triisopropoxysilane, n-butyl tri-n-butoxysilane, n-butyl tri-sec-butoxysilane, n-butyl tri-t-butoxysilane, n-butyl triphenoxysilane, sec-butyl trimethoxysilane, sec-butyl triethoxysilane, sec-butyl tri-n-propoxysilane, sec-butyl triisopropoxysilane, sec-butyl tri-n-butoxysilane, sec-butyl tri-sec-butoxysilane, sec-butyl tri-t-butoxysilane, sec-butyl triphenoxysilane, t-butyl trimethoxysilane, t-butyl triethoxysilane, t-butyl tri-n-propoxysilane, t-butyl triisopropoxysilane, t-butyl tri-n-butoxysilane, t-butyl tri-sec-butoxysilane, t-butyl tri-t-butoxysilane, t-butyl triphenoxysilane, phenyl trimethoxysilane, phenyl triethoxysilane, phenyl tri-n-propoxysilane, phenyl triisopropoxysilane, phenyl tri-n-butoxysilane, phenyl tri-sec-butoxysilane, phenyl tri-t-butoxysilane, phenyl triphenoxysilane, vinyl trimethoxysilane, vinyl triethoxysilane, γ-aminopropyl trimethoxysilane, γ-aminopropyl triethoxysilane, γ-glycidoxypropyl trimethoxysilane, γ-glycidoxypropyl triethoxysilane, γ-trifluoropropyl trimethoxysilane, γ-trifluoropropyl triethoxysilane; dimethyl dimethoxysilane, dimethyl diethoxysilane, dimethyl di-n-propoxysilane, dimethyl diisopropoxysilane, dimethyl di-n-butoxysilane, dimethyl di-sec-butoxysilane, dimethyl di-t-butoxysilane, dimethyl diphenoxysilane, diethyl dimethoxysilane, diethyl diethoxysilane, diethyl di-n-propoxysilane, diethyl diisopropoxysilane, diethyl di-n-butoxysilane, diethyl di-sec-butoxysilane, diethyl di-t-butoxysilane, diethyl diphenoxysilane, di-n-propyl dimethoxysilane, di-n-propyl diethoxysilane, di-n-propyl di-n-propoxysilane, di-n-propyl diisopropoxysilane, di-n-propyl di-n-butoxysilane, di-n-propyl di-sec, butoxysilane, di-n-propyl di-t-butoxysilane, di-n-propyl diphenoxysilane, diisopropyl dimethoxysilane, diisopropyl diethoxysilane, diisopropyl di-propoxysilane, diisopropyl diisopropoxysilane, diisopropyl di-n-butoxysilane, diisopropyl di-sec-butoxysilane, diisopropyl di-t-butoxysilane, diisopropyl diphenoxysilane, di-n-butyl dimethoxysilane, di-n-butyl diethoxysilane, di-n-butyl di-n-propoxysilane, di-n-butyl diisopropoxysilane, di-n-butyl di-n-butoxysilane, di-n-butyl di-sec-butoxysilane, di-n-butyl di-t-butoxysilane, di-n-butyl diphenoxysilane, di-sec-butyl dimethoxysilane, di-sec-butyl diethoxysilane, di-sec-butyl di-n-propoxysilane, di-sec-butyl diisopropoxysilane, di-sec-butyldi-n-butoxysilane, di-sec-butyl di-sec-butoxysilane, di-sec-butyl di-t-butoxysilane, di-sec-butyl diphenoxysilane, di-t-butyl dimethoxysilane, di-t-butyl diethoxysilane, di-t-butyl di-n-propoxysilane, di-t-butyl diisopropoxysilane, di-t-butyl di-n-butoxysilane, di-t-butyl di-sec-butoxysilane, di-t-butyl di-t-butoxysilane, di-t-butyl diphenoxysilane, diphenyl dimethoxysilane, diphenyl diethoxysilane, diphenyl di-n-propoxysilane, diphenyl diisopropoxysilane, diphenyl di-n-butoxysilane, diphenyl di-dec-butoxysilane, diphenyl di-t-butoxysilane, diphenyldiphenoxysilane, and divinyl trimethoxysilane.

Compound (52) are preferably methyl trimethoxysilane, methyl triethoxysilane, methyl tri-n-propoxysilane, methyl triisopropoxysilane, ethyl trimethoxysilane, ethyl triethoxysilane, vinyl trimethoxysilane, vinyl triethoxysilane, phenyl trimethoxysilane, phenyl triethoxysilane, dimethyl dimethoxysilane, dimethyl diethoxysilane, diethyl di-methoxysilane, diethyl diethoxysilane, diphenyl dimethoxysilane, and diphenyl diethoxysilane.

Those compounds may be used alone or as a mixture of two or more thereof.

Compound (53):

In the above general formula (53), the monovalent organic groups represented by $R^{53}$ are the same organic groups as in the general formula (52).

Specific examples of the compound represented by the general formula (53) include tetramethoxysilane, tetraethoxysilane, tetra-n-propoxysilane, tetraisopropoxysilane, tetra-n-butoxysilane, tetra-sec-butoxysilane, tetra-t-butoxysilane, and tetraphenoxysilane.

Compound (54):

In the above general formula (54), the monovalent organic group represented by $R^{54}$ to $R^{57}$ are the same organic groups as in the general formula (52).

Examples of the compound represented by the general formula (54) wherein $R^{58}$ represents an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane,
1,1,1,3,3-pentamethoxy-3-ethyldisiloxane, 1,1,1,3,3-pentaethoxy-3-ethyldisiloxane,
1,1,1,3,3-pentaphenoxy-3-ethyldisiloxane, 1,1,1,3,3-pentamethoxy-3-phenyldisiloxane,
1,1,1,3,3-pentaethoxy-3-phenyldisiloxane, 1,1,1,3,3-pentaphenoxy-3-phenyldisiloxane,
1,1,3,3-tetramethoxy-1,3-dimethyldisiloxane,
1,1,3,3-tetraethoxy-1,3-dimethyldisiloxane,
1,1,3,3-tetraphenoxy-1,3-dimethyldisiloxane,
1,1,3,3-tetramethoxy-1,3-diethyldisiloxane, 1,1,3,3-tetraethoxy-1,3-diethyldisiloxane,
1,1,3,3-tetraphenoxy-1,3-diethyldisiloxane,
1,1,3,3-tetramethoxy-1,3-diphenyldisiloxane,
1,1,3,3-tetraethoxy-1,3-diphenyldisiloxane,
1,1,3,3-tetraphenoxy-1,3-diphenyldisiloxane,
1,1,3-trimethoxy-1,3,3-trimethyldisiloxane, 1,1,3-triethoxy-1,3,3-trimethyldisiloxane,
1,1,3-triphenoxy-1,3,3-trimethyldisiloxane, 1,1,3-trimethoxy-1,3,3-triethyldisiloxane,
1,1,3-triethoxy-1,3,3-triethyldisiloxane, 1,1,3-triphenoxy-1,3,3-triethyldisiloxane,
1,1,3-trimethoxy-1,3,3-triphenyldisiloxane, 1,1,3-triethoxy-1,3,3-triphenyldisiloxane,
1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane,
1,3-diphenoxy-1,1,3,3-tetramethyldisiloxane,
1,3-dimethoxy-1,1,3,3-tetraethyldisiloxane, 1,3-diethoxy-1,1,3,3-tetraethyldisiloxane,
1,3-diphenoxy-1,1,3,3-tetraethyldisiloxane,
1,3-dimethoxy-1,1,3,3-tetraphenyldisiloxane,
1,3-diethoxy-1,1,3,3-tetraphenyldisiloxane, and
1,3-diphenoxy-1,1,3,3-tetraphenyldisiloxane, Of those, preferable examples are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compound represented by the general formula (54) wherein d' represents 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane,
1,1,1,2,2-pentaphenoxy-2-methyldisilane, 1,1,1,2,2-pentamethoxy-2-ethyldisilane,
1,1,1,2,2-pentaethoxy-2-ethyldisilane, 1,1,1,2,2-pentaphenoxy-2-ethyldisilane,
1,1,1,2,2-pentamethoxy-2-phenyldisilane, 1,1,1,2,2-pentaethoxy-2-phenyldisilane,
1,1,1,2,2-pentaphenoxy-2-phenyldisilane, 1,1,2,2-tetramethoxy-1,2-dimethyldisilane,
1,1,2,2-tetraethoxy-1,2-dimethyldisilane, 1,1,2,2-tetraphenoxy-1,2-dimethyldisilane,
1,1,2,2-tetramethoxy-1,2-diethyldisilane, 1,1,2,2-tetraethoxy-1,2-diethyldisilane,
1,1,2,2-tetraphenoxy-1,2-diethyldisilane, 1,1,2,2-tetramethoxy-1,2-diphenyldisilane,
1,1,2,2-tetraethoxy-1,2-diphenyldisilane, 1,1,2,2-tetraphenoxy-1,2-diphenyldisilane,
1,1,2-trimethoxy-1,2,2-trimethyldisilane, 1,1,2-triethoxy-1,2,2-trimethyldisilane,
1,1,2-triphenoxy-1,2,2-trimethyldisilane, 1,1,2-trimethoxy-1,2,2-triethyldisilane,
1,1,2-triethoxy-1,2,2-triethyldisilane, 1,1,2-triphenoxy-1,2,2-triethyldisilane,
1,1,2-trimethoxy-1,2,2-triphenyldisilane, 1,1,2-triethoxy-1,2,2-triphenyldisilane,
1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane,
1,2-dimethoxy-1,1,2,2-tetraethyldisilane, 1,2-diethoxy-1,1,2,2-tetraethyldisilane,
1,2-diphenoxy-1,1,2,2-tetraethyldisilane, 1,2-dimethoxy-1,1,2,2-tetraphenyldisilane,
1,2-diethoxy-1,1,2,2-tetraphenyldisilane, and 1,2-diphenoxy-1,1,2,2-tetraphenyldisilane.

Of those, preferable examples are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compound represented by the general formula (54) wherein $R^{58}$ represents —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane,
1-(di-n-propoxymethylsilyl)-1-(tri-n-propoxysilyl)methane,
1-(diisopropoxymethylsilyl)-1-(triisopropoxysilyl)methane,
1-(di-n-butoxymethylsilyl)-1-(tri-n-butoxysilyl)methane,
1-(di-sec-butoxymethylsilyl)-1-(tri-sec-butoxysilyl)methane,
1-(di-t-butoxymethylsilyl)-1-(tri-t-butoxysilyl)methane,
1-(dimethoxymethylsilyl)-2-(trimethoxysilyl)ethane,
1-(diethoxymethylsilyl)-2-(triethoxysilyl)ethane,
1-(di-n-propoxymethylsilyl)-2-(tri-n-propoxysilyl)ethane,
1-(diisopropoxysilyl)-2-(triisopropoxysilyl)ethane,
1-(di-n-butoxymethylsilyl)-2-(tri-n-butoxysilyl)ethane,
1-(di-sec-butoxymethylsilyl)-2-(tri-sec-butoxysilyl)ethane,
1-(di-t-butoxymethyl silyl)-2-(tri-t-butoxysilyl)ethane,
bis(dimethoxymethylsilyl)methane, bis(diethoxymethylsilyl)methane,
bis(di-n-propoxymethylsilyl)methane, bis(diisopropoxymethylsilyl)methane,
bis(di-n-butoxymethylsilyl)methane, bis(di-sec-butoxymethylsilyl)methane,
bis(di-t-butoxymethylsilyl)methane, 1,2-bis(dimethoxymethylsilyl)ethane,
1,2-bis(diethoxymethylsilyl)ethane, 1,2-bis(di-n-propoxymethylsilyl)ethane,
1,2-bis(diisopropoxymethylsilyl)ethane, 1,2-bis(di-n-butoxymethylsilyl)ethane,
1,2-bis(di-sec-butoxymethylsilyl)ethane, 1,2-bis(di-t-butoxymethylsilyl)ethane,
1,2-bis(trimethoxysilyl)benzene, 1,2-bis(triethoxysilyl)benzene,
1,2-bis(tri-n-propoxysilyl)benzene, 1,2-bis(triisopropoxysilyl)benzene,
1,2-bis(tri-n-butoxysilyl)benzene, 1,2-bis(tri-sec-butoxysilyl)benzene,
1,2-bis(tri-t-butoxysilyl)benzene, 1,3-bis(trimethoxysilyl)benzene,
1,3-bis(triethoxysilyl)benzene, 1,3-bis(tri-n-propoxysilyl)benzene,
1,3-bis(triisopropoxysilyl)benzene, 1,3-bis(tri-n-butoxysilyl)benzene,
1,3-bis(tri-sec-butoxysilyl)benzene, 1,3-bis(tri-t-butoxysilyl)benzene,
1,4-bis(trimethoxysilyl)benzene, 1,4-bis(triethoxysilyl)benzene,
1,4-bis(tri-n-propoxysilyl)benzene, 1,4-bis(triisopropoxysilyl)benzene,
1,4-bis(tri-n-butoxysilyl)benzene, 1,4-bis(tri-sec-butoxysilyl)benzene, and
1,4-bis(tri-t-butoxysilyl)benzene.

Of those, preferable examples are bis(trimethoxysilyl)methane,
bis(triethoxysilyl)methane, 1,2-bis(trimethoxysilyl)ethane, 1,2-bis(triethoxysilyl)ethane,
1-(dimethoxymethylsilyl)-1-(trimethoxysilyl)methane,
1-(diethoxymethylsilyl)-1-(triethoxysilyl)methane,
1-(dimethoxymethylsilyl)-2-(trimethoxysilyl)ethane,
1-(diethoxymethylsilyl)-2-(triethoxysilyl)ethane, bis(dimethoxymethylsilyl)methane,
bis(diethoxymethylsilyl)methane, 1,2-bis(dimethoxymethylsilyl)ethane,
1,2-bis(diethoxymethylsilyl)ethane, 1,2-bis(trimethoxysilyl)benzene, 1,2-bis(tri-ethoxysilyl) benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

In the hydrolysis and condensation of at least one silane compound selected from the group consisting of Compounds (51) to (54), it is preferred to use water in an amount of more than 0.5 moles and 150 moles or less, and particularly preferably more than 0.5 moles and 130 moles or less per, mole of at least one silane compound selected from the group consisting of Compounds (51) to (54). When the amount of water added is 0.5 moles or less, the coating film may possibly be inferior in crack resistance, whereas when it exceeds 150 moles, deposition or gelation of the polymer may possibly occur during the hydrolysis and condensation.

In the hydrolysis and condensation of at least one silane compound selected from the group consisting of Compounds (51) to (54), a catalyst is used.

Examples of the catalyst that can be used include a metal chelate compound, an acid catalyst, and an alkaline catalyst.

Examples of the metal chelate compound include titanium chelate compounds such as triethoxy.mono(acetylacetonate) titanium, tri-n-propoxy.mono(acetylacetonate)titanium,
triisopropoxy.mono(acetylacetonate)titanium,
tri-n-butoxy.mono(acetylacetonate)titanium,
tri-sec-butoxy.mono(acetylacetonate)titanium,
tri-t-butoxy.mono(acetylacetonate)titanium, diethoxy.bis(acetylacetonate)titanium,
di-n-propoxy.bis(acetylacetonate)titanium, diisopropoxy.bis(acetylacetonate)titanium,
di-n-butoxy.bis(acetylacetonate)titanium, di-sec-butoxy.bis(acetylacetonate)titanium,
di-t-butoxy.bis(acetylacetonate)titanium, monoethoxy.tris(acetylacetonate)titanium,
mono-n-propoxy.tris(acetylacetonate)titanium,
monoisopropoxy.tris(acetylacetonate)titanium,
mono-n-butoxy.tris(acetylacetonate)titanium,
mono-sec-butoxy.tris(acetylacetonate)titanium,
mono-t-butoxy.tris(acetylacetonate)titanium, tetrakis(acetylacetonate)titanium,
triethoxy.mono(ethylacetoacetate)titanium, tri-n-propoxy.mono(ethyl acetoacetate)titanium,
triisopropoxy.mono(ethylacetoacetate)titanium, tri-n-butoxy.mono(ethylacetoacetate)titanium, tri-sec-butoxy.mono(ethylacetoacetate)titanium,
tri-t-butoxy.mono(ethylacetoacetate)titanium, diethoxy.bis (ethylacetoacetate)titanium, di-n-propoxy.bis(ethyl acetoacetate)titanium,
diisopropoxy.bis(ethylacetoacetate)titanium, di-n-butoxy.bis(ethyl acetoacetate)titanium, di-sec-butoxy.bis (ethylacetoacetate)titanium,
di-t-butoxy.bis(ethyl acetoacetate)titanium, monoethoxy.tris (ethyl acetoacetate)titanium, mono-n-propoxy.tris (ethylacetoacetate)titanium,
monoisopropoxy.tris(ethylacetoacetate)titanium, mono-n-butoxy.tris(ethyl acetoacetate)titanium, mono-sec-butoxy.tris(ethyl acetoacetate)titanium,
mono-t-butoxy.tris(ethylacetoacetate)titanium, tetrakis (ethyl acetoacetate)titanium,
mono(acetylacetonate)tris(ethylacetoacetate)titanium, bis (acetylacetonate)bis(ethyl acetoacetate)titanium, and tris (acetylacetonate)mono(ethyl acetoacetate)titanium;
zirconium chelate compounds such as triethoxy.mono (acetylacetonate)zirconium,
tri-n-propoxy.mono(acetylacetonate)zirconium,
triisopropoxy.mono(acetylacetonate)zirconium,
tri-n-butoxy.mono(acetylacetonate)zirconium,
tri-sec-butoxy.mono(acetylacetonate)zirconium,
tri-t-butoxy.mono(acetylacetonate)zirconium, diethoxy.bis (acetylacetonate)zirconium,
di-n-propoxy.bis(acetylacetonate)zirconium,
diisopropoxy.bis(acetylacetonate)zirconium,
di-n-butoxy.bis(acetylacetonate)zirconium,
di-sec-butoxy.bis(acetylacetonate)zirconium,
di-t-butoxy.bis(acetylacetonate)zirconium, monoethoxy.tris (acetylacetonate)zirconium,
mono-n-propoxy.tris(acetylacetonate)zirconium,
monoisopropoxy.tris(acetylacetonate)zirconium,
mono-n-butoxy.tris(acetylacetonate)zirconium,
mono-sec-butoxy.tris(acetylacetonate)zirconium,
mono-t-butoxy.tris(acetylacetonate)zirconium, tetrakis (acetylacetonate)zirconium,
triethoxy.mono(ethylacetoacetate)zirconium, tri-n-propoxy.mono(ethyl acetoacetate)zirconium, triisopropoxy.mono(ethylacetoacetate)zirconium,
tri-n-butoxy.mono(ethylacetoacetate)zirconium, tri-sec-butoxy.mono(ethyl acetoacetate)zirconium, tri-t-butoxy.mono(ethylacetoacetate)zirconium,
diethoxy.bis(ethylacetoacetate)zirconium, di-n-propoxy.bis (ethyl acetoacetate)zirconium, diisopropoxy.bis (ethylacetoacetate)zirconium,
di-n-butoxy.bis(ethyl acetoacetate)zirconium, di-sec-butoxy.bis(ethyl acetoacetate)zirconium, di-t-butoxy.bis (ethylacetoacetate)zirconium,
monoethoxy.tris(ethylacetoacetate)zirconium, mono-n-propoxy.tris(ethyl acetoacetate)zirconium, monoisopropoxy.tris(ethylacetoacetate)zirconium,
mono-n-butoxy.tris(ethylacetoacetate)zirconium, mono-sec-butoxy.tris(ethyl acetoacetate)zirconium, mono-t-butoxy.tris(ethylacetoacetate)zirconium, tetrakis(ethyl acetoacetate)zirconium, mono(acetylacetonate)tris (ethylacetoacetate)zirconium,
bis(acetylacetonate)bis(ethylacetoacetate)zirconium, and tris(acetylacetonate)inono(ethylacetoacetate)zirconium; and aluminum chelate compounds such as tris (acetylacetonate)aluminum and tris(ethyl acetoacetate) aluminum. Of these are preferable titanium and/or aluminum chelate compounds, and particularly preferably titanium chelate compounds.

Those metal chelate compounds may be used alone or as a mixture of two or more thereof.

Examples of the acid catalyst include inorganic acids such as hydrochloric acid, nitric acid, sulfuric acid, hydrofluoric acid, phosphoric acid, and boric acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidic acid, shikimic acid, 2-ethylhexanoic acid, oleic acid, stearic acid, linolic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, itaconic acid, mesaconic acid, citraconic acid, malic acid, a hydrolyzate of glutaric acid, a hydrolyzate of maleic anhydride, and a hydrolyzate of phthalic anhydride. Of those, organic carboxylic acids are preferable.

Those acid catalysts may be used alone or as a mixture of two or more thereof.

Examples of the alkaline catalyst include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, heptylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, and 1-amino-3-methylbutane, dimethylglycine. Of those, organic amines are preferable, and ammonia, alkylamines and tetraalkylammonium hydroxides are particularly preferable from the standpoint of adhesion to the substrate.

Those alkaline catalysts may be used alone or as a mixture of two or more thereof.

Amount of the catalyst used is usually from 0.00001 to 10 moles, and preferably from 0.00005 to 5 moles, per mole of the sum of the groups represented by the $R^{51}O$— group, the $R^{52}O$— group, the $R^{53}O$— group, the $R^{55}O$— group, and the $R^{56}O$— group contained in Compounds (51) to (54). When the amount of the catalyst used falls within the above-described range, there is a little of occurrence of deposition or gelation of the polymer during the reaction.

In this case, in the formation of the film (B), the catalyst that is used for hydrolysis of the compound selected from Compounds (52) to (54) is preferably an alkaline catalyst.

In the present invention, the film (B) is prepared by applying the film forming composition (B) comprising an alkoxysilane hydrolytic condensate usually dissolved or dispersed in an organic solvent and optionally additives, followed by heating.

The organic solvent can be selected from the group consisting of alcoholic solvents, ketone-based solvents, amide-based solvents, ester-based solvents, and aprotic solvents.

Of those organic solvents, organic solvents represented by the following general formula (100) are particularly preferable:

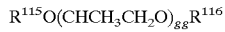

(100)

wherein $R^{115}$ and $R^{116}$ independently represent a hydrogen atom or a monovalent organic group selected from an alkyl group having from 1 to 4 carbon atoms and $CH_3CO$—; and gg represents an integer of from 1 to 2.

Those organic solvents may be used alone or as a mixture of two or more thereof.

In the film forming composition that is used in the present invention, the same solvent can be used during the hydrolysis and/or condensation of Compounds (51) to (54) constituting the alkoxysilane hydrolytic condensate.

Specifically, water or a solvent-diluted water is added intermittently or continuously to the solvent in which Compounds (51) to (54) are dissolved. During this time, the specific basic compound may be added previously in the solvent, or may be dissolved or dispersed in water during the hydrolysis. Reaction temperature is usually from 0 to 100° C., and preferably from 15 to 90° C.

Concentration of the total solids in the film forming coating solution (B) is preferably from 1 to 30% by weight, and is properly adjusted depending on the use purpose. When the concentration of the total solids in the composition is within the range of from 1 to 30% by weight, the film thickness of the coating film falls within a suitable range and is more superior in storage stability.

If desired, the adjustment of the concentration of the total solids is carried out through concentration or dilution with the above-described organic solvent.

In laminating the film (A) and the film (B), it is preferred that the coating film to be brought into contact with a CVD film is the coating film (A) from the standpoint of adhesion between the CVD film and the coating film.

Further, it is preferred that the film (A) has a film thickness of from $1/10$ to $1/1,000$ of that of the film (B). When the film thickness of the film (A) exceeds $1/10$ of that of the film (B), an effective dielectric constant of an insulating film becomes large, whereas when it is less than $1/1,000$, an improving effect of the adhesion to the CVD film becomes small.

The CVD film is a film containing Si and further containing at least one element selected from the group consisting of O, C, N, and H. Such a film is deposited films prepared by using a compound selected from, for example, tetramethoxysilane, tetraethoxysilane, methyl trimethoxysilane, methyl triethoxysilane, dimethyl dimethoxysilane, dimethyl diethoxysilane, silane, tetramethylsilane, trimethylsilane, dimethylsilane, methylsilane, ethylsilane, phenylsilane, diphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,1,3,3-tetramethyldisiloxane, trimethylsiloxane, 1,3-bis(silanomethyl)disiloxane, bis(1-methyldisiloxanyl)methane, 2,2-bis(1-methyldisiloxanyl) propane, 2,4,6,8-tetramethylcyclotetrasiloxane, octamethylcyclotetrasiloxane, 2,4,6-trisilanetetrahydropyran, 2,5-disilanetetrahydrofuran, and derivatives thereof and subjecting the compound to plasma polymerization in the presence of, for example, oxygen, carbon monoxide, carbon dioxide, nitrogen, argon, water, ozone, ammonia, or $N_2O$.

In applying the film forming composition to a substrate, coating means such as spin coating, dip coating, role coating, and spray coating is used.

The film can be formed in a film thickness (on a dry basis) of from about 0.02 to 2.5 μm in single coating and of from about 0.04 to 5.0 μm in double coating. Thereafter, the film is dried at ambient temperature, or dried usually under heating at a temperature of from about 80 to 600° C. for from about 5 to 240 minutes. Thus, a glassy or macromolecular insulating film can be formed.

Examples of the heating means that can be used include a hot plate, an oven, and a furnace. The heating may be carried out in an atmospheric environment, a nitrogen atmosphere, or an argon atmosphere, in vacuo, or under a reduced pressure at which an oxygen concentration is controlled.

Further, the film may be formed upon irradiation with electron beams or ultraviolet rays.

In order to regulate the curing rate of the film, if desired, the film may be heated stepwise, or an atmosphere of nitrogen, air or oxygen or an atmosphere under reduced pressure may be used.

The thus obtained dielectric film is superior in adhesion to the CVD film. Accordingly, it is useful for applications such as dielectric films for semiconductor devices including LSI, system LSI, DRAM, SDRAM, RDRAM, and D-RDRAM, etching stopper films, protective films such as surface coating films of semiconductor devices, dielectric layers in the preparation step of semiconductors using multilayered resists, dielectric films of multilayered wiring boards, protective films or insulating films for liquid crystal display devices, and protective films or insulating films for electroluminescence display devices.

The present invention will be described more specifically with reference to the following Examples. However, the following description will generalize embodiments of the present invention, and it should not be construed that the invention is limited thereto without particular reasons.

In the Examples and Comparative Examples, all parts and percentages are on a weight basis unless otherwise indicated.

Various evaluations were made in the following manners.

Dielectric Constant of Coating Film:

A composition sample was applied on an 8-inch silicone wafer by spin coating, and a substrate was dried at 80° C. for 1 minute on a hot plate and then at 200° C. for 1 minute in a nitrogen atmosphere. The substrate was further cured on the hot plate in a nitrogen atmosphere at 400° C. for 22 minutes. An aluminum electrode pattern was formed on the thus obtained film by vapor deposition, to prepare a sample for measurement of dielectric constant. The sample was subjected to measurement of dielectric constant of the film at a frequency of 100 kHz by the CV process using HP16451B Electrodes and HP4284A Precision LCR Meter (all being available from Yokogawa-Hewlett-Packard, Ltd.).

Adhesion of Stacked Film:

The adhesion of a stacked film was carried out in the following manner. A substrate was dipped in warm water at 80° C. for 5 hours, and then dried on a hot plate at 100° C. Thereafter, ten stud pins was fixed on the uppermost layer of the substrate using an epoxy resin, followed by drying at 150° C. for one hour. The stud pins were then subjected to a drawing test by the Sebastian process, and the adhesion was evaluated according to the following criteria.

Good adhesion: No peeling occurred in an interface between the CVD film and the film with respect to all of the ten stud pins.

Poor adhesion: Peeling occurred in an interface between the CVD film and the film.

SYNTHESIS EXAMPLE 1

7.5 g of sodium iodide, 1.3 g of anhydrous nickel chloride, 15.7 g of triphenylphosphine, 19.6 g of a zinc powder activated with acetic acid, and 16.7 g of 9,9-bis (methylsulfonyloxy)fluorene were charged in a three-necked flask, and the mixture was dried in vacuo for 24 hours. An argon gas was filled in the three-necked flask. 50 ml of dry N,N-dimethylacetamide, 50 ml of dry tetrahydrofuran, and 10.8 g of 2,4-dichlorotoluene were added, and the mixture was stirred at 70° C. under an argon gas stream. As a result, the reaction mixture became brown. The reaction was continued at 70° C. for an additional 20 hours, and the resulting reaction mixture was poured into a mixed solution of 400 ml of 36% hydrochloric acid and 1,600 ml of methanol to recover a precipitate.

The thus recovered precipitate was suspended in chloroform and extracted with an aqueous 2N hydrochloric acid solution. The chloroform layer was then poured into methanol to recover a precipitate, followed drying. As a result, a polymer (1) having a weight average molecular weight of 10,300 in a white powdery state was obtained. Two grams of this polymer (1) was dissolved in 18 g of mesitylene to obtain a solution (1). A coating film was evaluated and found to have a dielectric constant of 2.94.

SYNTHESIS EXAMPLE 2

26.48 g of 9,9-bis(4-hydroxyphenyl)fluorene, 28.35 g of 9,9-bis(4-hydro-3-methyloxyphenyl)fluorene, 45.60 g of anhydrous potassium carbonate, 500 ml of dimethylacetamide, and 150 ml of toluene were charged in a one-liter three-necked flask equipped with a nitrogen-introducing tube, a Dean-Stark unit, and a condenser, and the mixture was heated at 140° C. for 3 hours in a nitrogen atmosphere. After removing water formed during the salt formation and the excessive toluene, the reaction mixture was cooled to room temperature. 32.73 g of 4,4'-difluorobenzophenone was added to the reaction mixture, and the mixture was allowed to react at 165° C. for 10 hours. After cooling, the reaction mixture was added to 5 liters of 10% HCl-containing methanol and subjected to reprecipitation. The precipitate was filtered, thoroughly washed with ion-exchanged water, and then preliminarily dried in a vacuum oven. The resulting precipitate was again dissolved in tetrahydrofuran, and after removing insoluble matters, the residue was subjected to reprecipitation in methanol. The reprecipitation operation was repeated once again, to purify the polymer. Drying was carried out in a vacuum oven at 80° C. for 12 hours. As a result, a polymer (2) having a weight average molecular weight of 150,000 in a white powdery state was obtained. Two grams of this polymer (2) was dissolved in 18 g of cyclohexanone to obtain a solution (2). A coating film was evaluated and found to have a dielectric constant of 3.13.

SYNTHESIS EXAMPLE 3

120 ml of tetrahydrofuran, 3.46 g of tetrakis(triphenylphosphine)palladium, 2.1 g of dichlorobis(triphenylphosphine)palladium, 1.44 g of copper iodide, 20 ml of piperidine, and 185.72 g of 4,4'-bis(2-iodophenoxy) benzophene were charged in a 1,000-mL three-necked flask equipped with a thermometer, an argon gas-introducing tube, and a stirrer. 65.48 g of 4,4'-diethynyldiphenyl ether was further added, and the mixture was allowed to react at 25° C. for 20 hours. The reaction mixture was subjected to reprecipitation twice with 5 liters of acetic acid. The precipitate was dissolved in cyclohexanone, washed twice with extra pure water, and then subjected to reprecipitation with 5 liters of methanol. The precipitate was filtered and dried to obtain a polymer (3) having a weight average molecular weight of 35,000. Two grams of this polymer (3) was dissolved in 18 g of cyclohexanone to obtain a solution (3). A coating film was evaluated and found to have a dielectric constant of 3.06.

SYNTHESIS EXAMPLE 4

570 g of distilled ethanol, 160 g of ion-exchanged water, and 30 g of an aqueous 10% tetramethylammonium hydroxide solution were charged in a quartz-made separable flask, and the mixture was uniformly stirred. A mixture of 136 g of methyl trimethoxysilane and 209 g of tetraethoxysilane was added to the solution, and the resulting solution was allowed to react for 5 hours while maintaining at 60° C. 300 g of propylene glycol monopropyl ether was added to the reaction mixture, and the mixture was concentrated using an evaporator at 50° C. until the concentration became 10% (converted as the completely hydrolytic condensation). 10 g of a 10% solution of acetic acid in propylene glycol monopropyl ether was added to the concentrated solution, to obtain a reaction solution (1).

The thus obtained reaction solution (1) was measured and found to have a dielectric constant of 2.23.

SYNTHESIS EXAMPLE 5

470.9 g of distilled ethanol, 226.5 g of ion-exchanged water, and 10.2 g of an aqueous 10% potassium hydroxide solution were charged in a quartz-made separable flask, and the mixture was uniformly stirred. A mixture of 44.9 g of methyl trimethoxysilane and 68.6 g of tetraethoxysilane was added to the solution over 30 minutes, and the resulting solution was allowed to react for 2 hours while maintaining at 55° C. 80 g of an aqueous 20% maleic acid solution was added to the reaction mixture, and the mixture was thoroughly stirred, followed by cooling to room temperature. 400 g of propylene glycol monopropyl ether was added to the resulting solution, and the mixture was concentrated using an evaporator at 50° C. until the concentration became 10% (converted as the completely hydrolytic condensation). 10 g of a 10% solution of maleic acid in propylene glycol monopropyl ether was added to the concentrated solution, to obtain a reaction solution (2).

The thus obtained reaction solution (2) was measured and found to have a dielectric constant of 2.13.

SYNTHESIS EXAMPLE 6

In a quartz-made separable flask, 324.40 g of methyl trimethoxysilane and 123.64 g of trimethoxysilane were dissolved in 298 g of propylene glycol monoethyl ether, and the mixture was stirred using a three-one motor, thereby stabilizing the solution temperature at 55° C. 254 g of ion-exchanged water having 0.20 g of phthalic acid dissolved therein was added thereto over one hour. The mixture was allowed to react at 50° C. for 3 hours. 502 g of propylene glycol monoethyl ether was added to the reaction mixture, followed by cooling to room temperature. 502 g of the solution containing methanol and ethanol was removed from the reaction mixture at 50° C. using an evaporator, to obtain a reaction solution (3).

The thus obtained reaction solution (3) was measured and found to have a dielectric constant of 2.73.

SYNTHESIS EXAMPLE 7

In a quartz-made separable flask, 77.04 g of distilled trimethoxysilane and 0.48 g of tetrakis(acetylacetonate) titanium were dissolved in 290 g of distilled propylene glycol monopropyl ether, and the mixture was stirred using a three-one motor, thereby stabilizing the solution temperature at 60° C. 84 g of ion-exchanged water was added thereto over one hour. The mixture was allowed to react at 60° C. for 2 hours. 25 g of distilled acetylacetone was added thereto, and the resulting mixture was allowed to react for an additional 30 minutes, followed by cooling to room temperature. 149 g of the solution containing methanol and water was removed from the reaction mixture at 50° C. using an evaporator, to obtain a reaction solution (4).

The thus obtained reaction solution (4) was measured and found to have a dielectric constant of 2.97.

EXAMPLE 1

A CVD film made of tetraethoxysilane having a film thickness of 1,000 angstroms was formed on an 8-inch silicone wafer using Producer S available from Applied Material. This coating film had an elemental composition of Si (32 atomic %), O (64 atomic %) and H (4 atomic %).

The solution (1) was applied in a film thickness of 100 angstroms on this coating film, and the substrate was dried at 80° C. for 1 minute and then at 200° C. for 1 minute. Further, the reaction solution (1) was applied in a film thickness of 5,000 angstroms on this substrate, and the substrate was dried at 80° C. for 1 minute and then at 200° C. for 1 minute. The resulting substrate was cured on a hot plate in a nitrogen atmosphere at 400° C. for 22 minutes.

The adhesion of the laminate film was evaluated. As a result, no peeling in an interface between the CVD film and the coating film was observed.

EXAMPLE 2

A CVD film made of tetramethylsilane having a film thickness of 1,000 angstroms was formed on an 8-inch silicone wafer using Producer S available from Applied Material. This coating film had an elemental composition of Si (26 atomic %), O (3 atomic %), C (26 atomic %) and H (45 atomic %).

The solution (2) was applied in a film thickness of 100 angstroms on this coating film, and the substrate was dried at 80° C. for one minute and then at 200° C. for one minute. Further, the reaction solution (2) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, no peeling in an interface between the CVD film and the coating film was observed.

EXAMPLE 3

A CVD film made of trimethylsilane having a film thickness of 1,000 angstroms was formed on an 8-inch silicone wafer using Sequel Express available from Nevellus. This coating film had an elemental composition of Si (25 atomic %), O (4 atomic %), C (21 atomic %), N (14 atomic %) and H (36 atomic %).

The solution (3) was applied in a film thickness of 100 angstroms on this coating film, and the substrate was dried at 80° C. for one minute and then at 200° C. for one minute. Further, the reaction solution (1) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, no peeling in an interface between the CVD film and the coating film was observed.

EXAMPLE 4

A CVD film made of silane and ammonia having a film thickness of 1,000 angstroms was formed on an 8-inch silicone wafer using Sequel Express available from Nevellus. This coating film had an elemental composition of Si (49 atomic %), O (4 atomic %), C (3 atomic %), N (40 atomic %) and H (4 atomic %).

The solution (3) was applied in a film thickness of 50 angstroms on this coating film, and the substrate was dried at 80° C. for one minute and then at 200° C. for one minute. Further, a mixed solution of 30 g of the reaction solution (1) and 5 g of the reaction solution (3) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, no peeling in an interface between the CVD film and the coating film was observed.

EXAMPLE 5

A CVD film made of silane and ammonia having a film thickness of 1,000 angstroms was formed on an 8-inch silicone wafer using Sequel Express available from Nevellus. This coating film had an elemental composition of Si (49 atomic %), O (4 atomic %), C (3 atomic %), N (40 atomic %) and H (4 atomic %).

The solution (3) was applied in a film thickness of 50 angstroms on this coating film, and the substrate was dried at 80° C. for one minute and then at 200° C. for one minute. Further, a mixed solution of 30 g of the reaction solution (1) and 5 g of the reaction solution (4) was applied in a film thickness of 4,000 angstroms on this substrate, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, no peeling in an interface between the CVD film and the coating film was observed.

EXAMPLE 6

The reaction solution (3) was applied in a film thickness of 50 angstroms on the substrate obtained in Example 2, and the substrate was dried at 80° C. for one minute and then at 200° C. for one minute. The resulting substrate was cured on a hot plate in a nitrogen atmosphere at 400° C. for 22 minutes. A CVD film made of tetraethoxysilane having a film thickness of 1,000 angstroms was formed on this substrate using Producer S available from Applied Material. This coating film had an elemental composition of Si (26 atomic %), O (3 atomic %), C (26 atomic %) and H (45 atomic %).

The adhesion of the laminate film was evaluated. As a result, no peeling in an interface between the CVD film and the coating film was observed.

EXAMPLE 7

The reaction solution (2) was applied in a film thickness of 50 angstroms on the substrate obtained in Example 3, and the substrate was dried at 80° C. for one minute and then at 200° C. for one minute. The resulting substrate was cured on a hot plate in a nitrogen atmosphere at 400° C. for 22 minutes. A CVD film made of trimethylsilane having a film thickness of 1,000 angstroms was formed on this substrate using Sequel Express available from Nevellus. This coating film had an elemental composition of Si (25 atomic %), O (4 atomic %), C (21 atomic %), N (14 atomic %) and H (36 atomic %).

The adhesion of the laminate film was evaluated. As a result, no peeling in an interface between the CVD film and the coating film was observed.

COMPARATIVE EXAMPLE 1

A CVD film made of tetraethoxysilane having a film thickness of 1,000 angstroms was formed on an 8-inch silicone wafer using Producer S available from Applied Material. This coating film had an elemental composition of Si (32 atomic %), O (64 atomic %) and H (4 atomic %).

The reaction solution (1) was applied in a film thickness of 5,000 angstroms on this coating film, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, peeling was observed in an interface between the CVD film and the coating film with respect to the eight stud pins.

COMPARATIVE EXAMPLE 2

A CVD film made of tetraethoxysilane having a film thickness of 1,000 angstroms was formed on an 8-inch silicone wafer using Producer S available from Applied Material. This coating film had an elemental composition of Si (32 atomic %), O (64 atomic %) and H (4 atomic %).

The reaction solution (2) was applied in a film thickness of 5,000 angstroms on this coating film, and the substrate was dried at 80° C. for one minute and then at 200° C. for one minute. The resulting substrate was cured on a hot plate in a nitrogen atmosphere at 400° C. for 22 minutes.

The adhesion of the laminate film was evaluated. As a result, peeling was observed in an interface between the CVD film and the coating film with respect to the nine stud pins.

According to the present invention, it is possible to provide a dielectric film (substrate for semiconductor) having superior adhesion to a CVD film by using a laminate film of (A) a coating film having a carbon content of 60% by weight or more in a composition and a hydrolytic condensate of an alkoxysilane.

What is claimed is:

1. A method for the production of a stacked film, which comprises:

forming (A) a film of an organic compound having a carbon content of 60% by weight or more comprising at least one recurring structural unit selected from the group consisting of the following formulae (1), (2) and (3):

formula (1):

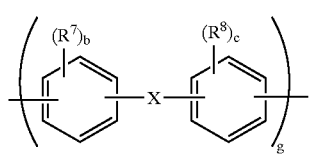

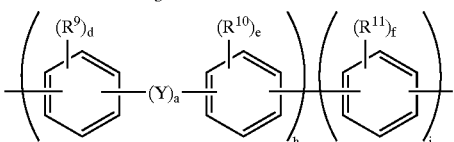

formula (2):

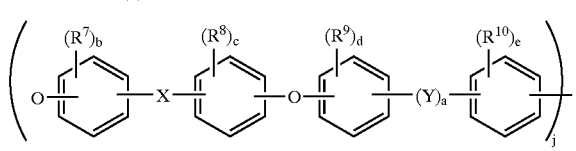

formula (3):

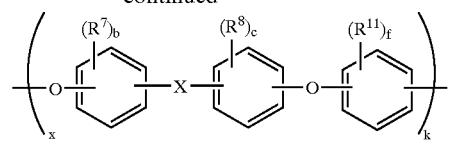

$-\!\!\!+\!\!\mathrm{C}\!\!\equiv\!\!\mathrm{C}\!-\!\mathrm{A}\!-\!\mathrm{C}\!\!\equiv\!\!\mathrm{C}\!-\!\mathrm{B}\!+\!\!\!-$ wherein $R^7$ to $R^{11}$ each independently represents a hydrocarbon group having from 1 to 20 carbon atoms, a cyano group, a nitro group, an ailcoxyl group having from 1 to 20 carbon atoms, an aryl group, or a halogen atom; X represents at least one member selected from the group consisting of a group represented by —CQQ'-, wherein Q and Q' may be the same or different and each represents a halogenated alkyl group, an alkyl group, a hydrogen atom, a halogen atom, or an aryl group, and a fluorenylene group; Y represents at least one member selected from the group consisting of —O—, —CO—, —COO—, —CONH—, —S—, —SO₂—, and a phenylene group; a represents 0 or 1; b to f each represents an integer of from 0 to 4; g is from 5 to 100 mole %, h is from 0 to 95 mole %, and i is from 0 to 95 mole %, provided that the total sum of g, h and i is 100 mole %; j is from 0 to 100 mole %, and k is from 0 to 100 mole %, provided that the total sum of j and k is 100 mole %; and A and B each independently represents at least one group selected from the group consisting of divalent aromatic groups represented by the following formulae (4), (5) and (6);

formula (4):

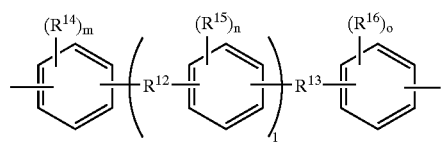

formula (5):

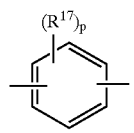

formula (6):

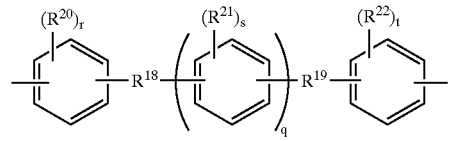

wherein $R^{12}$, $R^{13}$, $R^{18}$, and $R^{19}$ each independently represents a single bond,

a phenylene group, an isopropylidene group, a hexafluoroisopropylidene group, a diphenylmethylidene group, or a fluorenylene group; $R^{14}$ to $R^{16}$, $R^{17}$, and $R^{20}$ to $R^{22}$ each independently represents a hydrocarbon group having from 1 to 20 carbon atoms, a cyano group, a intro group, or an alkoxyl group having from 1 to 20 carbon atoms, an aryl group; l and q each independently represents an integer of from 0 to 3; and M, to p and r to t each independently represents an integer of from 0 to 4, on a substrate containing Si and further containing at least one element selected from the group consisting of O, C, N and H; and forming, on the film (A), (B) a film prepared by heating a hydrolytic condensate obtained by hydrolysis and condensation of at least one compound selected from the group consisting of compounds represented by the following formulae (51), (52), (53) and (54) in the presence of an alkaline catalyst:

$$HSi(OR^{51})_3 \tag{51}$$

wherein $R^{51}$ represents a monovalent organic group, $$Ra \cdot Si(OR^{52})_{4-a'} \tag{52}$$

wherein R represents a fluorine atom or a monovalent organic group; $R^{52}$ represents a monovalent organic group; and a' represents an integer of from 1 to 2, $$Si(OR^{53})_4 \tag{53}$$

wherein $R^{53}$ represents a monovalent organic group, and $$R^{54}{}_{b'}(R^{55}O)_{3-b'}Si-R^{58}{}_{d'}-Si(OR^{56})_{3-c'}R^{57}{}_{c'} \tag{54}$$

wherein $R^{54}$ to $R^{57}$ may be the same or different and each represents a monovalent organic group; b' and c' may be the same or different and each represents a number of from 0 to 2; $R^{58}$ represents an oxygen atom, a phenylene group, or a group represented by —(CH$_2$)$_{n'}$—, wherein n' represents an integer of from 1 to 6; and d' represents 0 or 1.

2. An insulating film comprising a stacked film prepared by the method as claimed in claim 1.

3. A substrate for a semiconductor comprising an insulating film prepared by the method as claimed in claim 1.

4. The method for the production of a stacked film as claimed in ciaim 1, which further comprises
   forming a film containing Si, O, C, N and H, on the film (B).

5. The method as claimed in claim 1, wherein the alkaline catalyst is potassium hydroxide.

6. The method as claimed in claim 1, wherein the film (B) is prepared by heating the hydrolytic condensate in the presence of an ethylenically unsaturated monomer.

7. A method for the production of a stacked film, which comprises:
   forming (A) a film of an organic compound having a carbon content of 60% by weight or more comprising at least one recurring structural unit selected from the group consisting of the following formulae (1), (2) and (3):

formula (1):

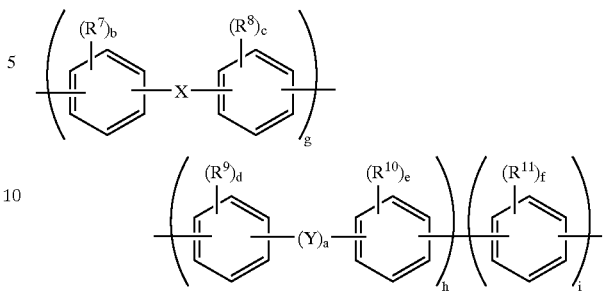

formula (2):

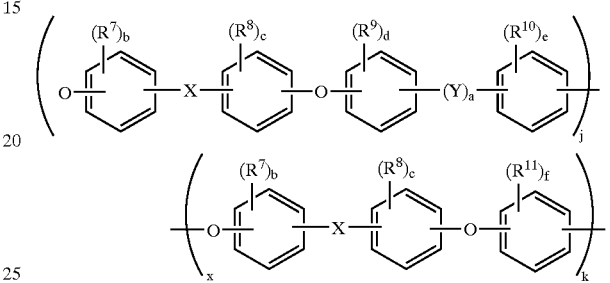

formula (3):

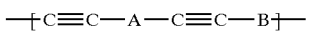

wherein $R^7$ to $R^{11}$ each independently represents a hydrocarbon group having from 1 to 20 carbon atoms, a cyano group, a nitro group, an alkoxyl group hawing from 1 to 20 carbon atoms, an aryl group, or a halogen atom; X represents at least one member selected from the group consisting of a group represented by —CQQ'—, wherein Q and Q' may be the same or different and each represents a halogenated alkyl group, an alkyl group, a hydrogen atom, a halogen atom, or an aryl group, and a fluorenylene group; Y represents at least one member selected from the group consisting of —O—, —CO—, —COO—, —CONH, —S—, —SO$_2$—, and a phenylene group; a represents 0 or 1; b to f each represents an integer of from 0 to 4; g is from 5 to 100 mole %, h is from 0 to 95 mole %, and l is from 0 to 95 mole %, provided that the total sum of g, h and i is 100 mole %; j is from 0 to 100 mole %, and k is from 0 to 100 mole %, provided that the total sum of j, and k is 100 mole %; and A and B each independently represents at least one group selected from the group consisting of divalent aromatic groups represented by the following formulae (4), (5) and (6):

formula (4):

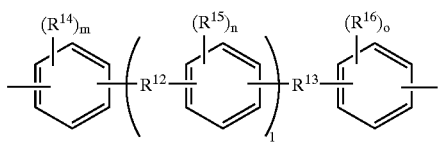

formula (5):

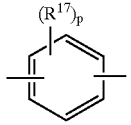

-continued formula (6):

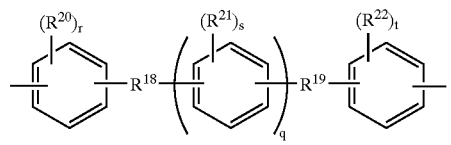

wherein $R^{12}$, $R^{13}$, $R^{18}$, and $R^{19}$ each independently represents a single bond,

—O—, —CO—, —CH$_2$—,

—COO—, —CONH—, —S—,

—SO$_2$—, 

a phenylene group, an isopropylidene group, a hexafluoroisopropylidene group, a diphenylmethylidene group, or a fluorenylene group; $R^{14}$ to $R^{16}$, $R^{17}$, and $R^{20}$ to $R^{22}$ each independently represents a hydrocarbon group having from 1 to 20 carbon atoms, a cyano group, a intro group, or an alkoxyl group having from 1 to 20 carbon atoms, an aryl group; 1 and q each independently represents an integer of from 0 to 3; and M, to p and r to t each independently represents an integer of from 0 to 4, on a substrate containing Si and further containing at least one element selected from the group consisting of O, C, N and H; and forming, on the film (A), (B) a film prepared by heating a hydrolytic condensate obtained by hydrolysis and condensation of at least one compound selected from the group consisting of compounds represented by the following formulae (51), (52), (53) and (54)

$$\text{HSi}(\text{OR}^{51})_3 \tag{51}$$

wherein $R^{51}$ represents a monovalent organic group, $$R_a\text{Si}(\text{OR}^{52})_{4-a'} \tag{52}$$

wherein R represents a fluorine atom or a monovalent organic group; $R^{52}$ represents a monovalent organic group; and a' represents an integer of from 1 to 2, $$\text{Si}(\text{OR}^{53})_4 \tag{53}$$

wherein $R^{53}$ represents a monovalent organic group, and $$R^{54}{}_{b'}(R^{55}\text{O})_{3-b'}\text{Si}—R^{58})_{d'}—\text{Si}(\text{OR}^{56})_{3-c'}R^{57}{}_{c'} \tag{54}$$

wherein $R^{54}$ to $R^{57}$ may be the same or different and each represents a monovalent organic group; b' and c' may be the same or different and each represents a number of from 0 to 2; $R^{58}$ represents an oxygen atom, a phenylene group, or a group represented by —(CH$_2$)$_{n'}$—, wherein n' represents an integer of from 1 to 6; and d' represents 0 or 1; and further forming a film containing Si and at least one element selected from the group consisting of O, C, N and H, on the film (B).

8. An insulating film comprising a stacked film prepared by the method as claimed in claim 7.

9. A substrate for a semiconductor comprising an insulating film prepared by the method as claimed in claim 7.

10. The method as claimed in claim 1, wherein the alkaline catalyst is at least one selected from the group consisting of ammonia, an alkylamine and a tetraalkylanimonium hydroxide.

11. A substrate for a semiconductor comprising an insulating film prepared by the method as claimed in claim 10.

12. A substrate for a semiconductor comprising an insulating film prepared by the method as claimed in claim 7.

13. The method as claimed in claim 6, wherein the ethylenically unsaturated monomer is at least one of maleic acid or phthalic acid.

* * * * *